United States Patent [19]

Hara et al.

[11] Patent Number: 5,146,509
[45] Date of Patent: Sep. 8, 1992

[54] METHOD OF INSPECTING DEFECTS IN CIRCUIT PATTERN AND SYSTEM FOR CARRYING OUT THE METHOD

[75] Inventors: Yasuhiko Hara, Machida; Mitsuyoshi Koizumi; Shigeki Kitamura, both of Yokohama, all of Japan

[73] Assignees: Hitachi, Ltd.; Hitachi Video Engineering, Inc., Tokyo, Japan

[21] Appl. No.: 575,380

[22] Filed: Aug. 28, 1990

[30] Foreign Application Priority Data

Aug. 30, 1989 [JP] Japan ................... 1-221450

[51] Int. Cl.⁵ ............................................. G06K 9/03
[52] U.S. Cl. ........................................ 382/8; 382/25; 358/101; 358/106
[58] Field of Search ............... 382/8, 25, 26; 358/106, 358/101, 107; 356/237

[56] References Cited

U.S. PATENT DOCUMENTS

| | | | |
|---|---|---|---|
| 4,148,065 | 4/1979 | Nakagawa et al. | 358/101 |
| 4,421,410 | 12/1983 | Karasaki | 356/378 |
| 4,481,664 | 11/1984 | Linger et al. | 382/8 |
| 4,484,081 | 11/1984 | Cornyn, Jr. et al. | 250/563 |
| 4,496,971 | 1/1985 | West et al. | 358/106 |
| 4,587,617 | 5/1986 | Barker et al. | 364/507 |
| 4,628,531 | 12/1986 | Okamoto et al. | 382/8 |
| 4,659,220 | 4/1987 | Bronte et al. | 356/237 |
| 4,692,943 | 9/1987 | Pietzsch et al. | 382/8 |
| 4,908,871 | 3/1990 | Hara et al. | 382/8 |

FOREIGN PATENT DOCUMENTS

59-0024361 6/1984 Japan .
62-0247478 10/1987 Japan .

OTHER PUBLICATIONS

Yasuhiko Hara et al., Automatic Inspection for Printed Circuit Boards, IEEE Transactions on Pattern Analysis and Machine Intelligence, vol. PAMI-5, No. 6, Nov. 1983, pp. 623-630.

Takeshi Uno et al., "Recognition of Abnormalities in Complex Patterns", 1973 Convention of the Institute of Electrical Engineers of Japan, Paper No. 1347, pp. 1821-1822.

Yasuhiko Hara et al., "Automatic Inspection of Reticle Patterns Referenced to Its Design Data", A Collection of Papers by Members of Japanesse Instrumentation Automatic Control Society, vol. 20, No. 12, Dec. 1984, pp. 63-70.

Kazunori Fujiwara et al., "High-Speed Image Recognition Processor HIDIC-IP/200 and Its Applications", Hitachi Hyoron, vol. 70, No. 7, Jul. 1988, pp. 69-75.

*Primary Examiner*—Leo H. Boudreau
*Assistant Examiner*—Andrew W. Johns
*Attorney, Agent, or Firm*—Fay, Sharpe, Beall, Fagan, Minnich & McKee

[57] ABSTRACT

A circuit pattern to be inspected is imaged so that an image signal representing the circuit pattern to be inspected is produced. The image signal of the circuit pattern is compared with a reference circuit pattern image signal, wherein a part of the image signal discerned to be different from the latter is detected as a candidate defect, at a rate synchronized with the rate of imaging. A local image signal corresponding to each local image covering a region including every one of detected candidate defects is extracted and stored in a memory device. Thereafter, on the basis of the local image signal read out from the memory device, whether or not the candidate defect concerned is fatally harmful with regard to electrical conductivity is examined at a rate asynchronous with the imaging rate.

21 Claims, 22 Drawing Sheets

FIG. 8
| | HARMFUL DEFECT | HARMLESS DEFECT |
|---|---|---|
| (i) | 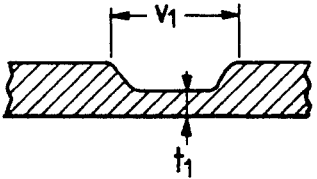 | 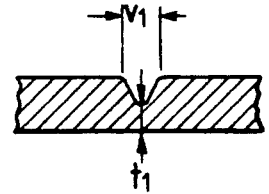 |
| (ii) | 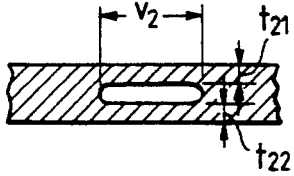<br>$t_2 = t_{21} + t_{22}$ | 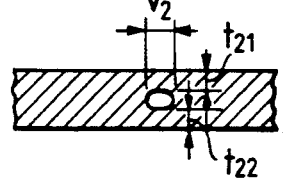<br>$t_2 = t_{21} + t_{22}$ |
| (iii) | 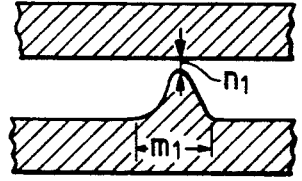 | 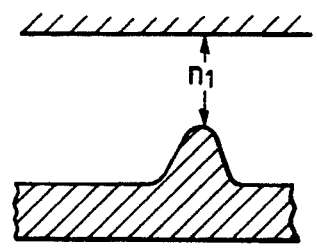 |
| (iv) | 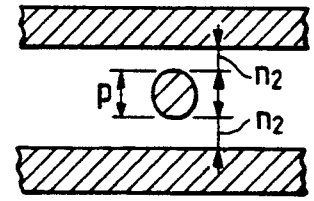 | 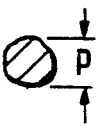 |

FIG. 9

| | HARMFUL DEFECT | HARMLESS DEFECT |
|---|---|---|
| (V) | $\Sigma Si$ | $\Sigma Si$ |
| (Vi) | $\Sigma \ell i$ | $\Sigma \ell i$ |
| (Vii) | | |

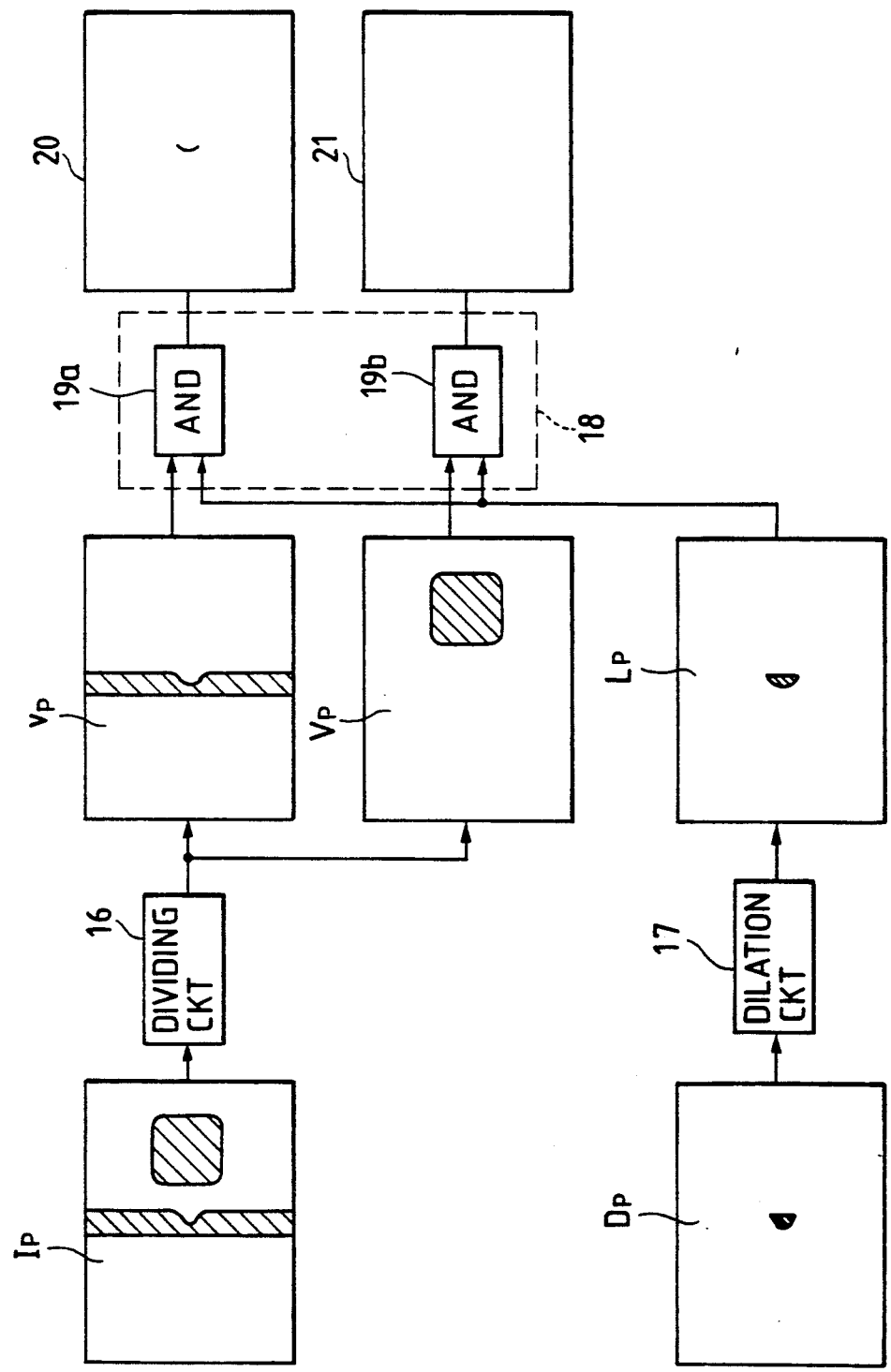

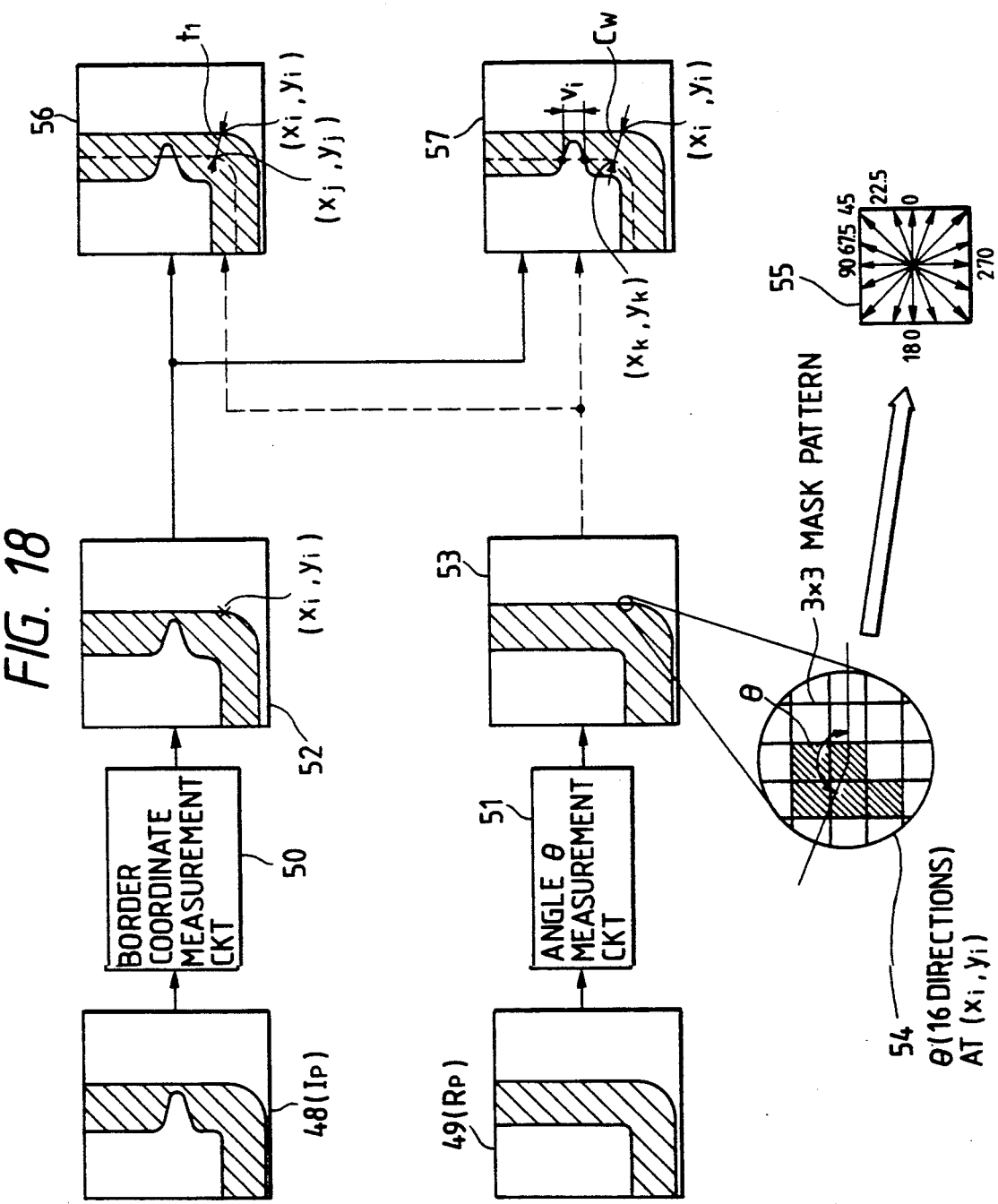

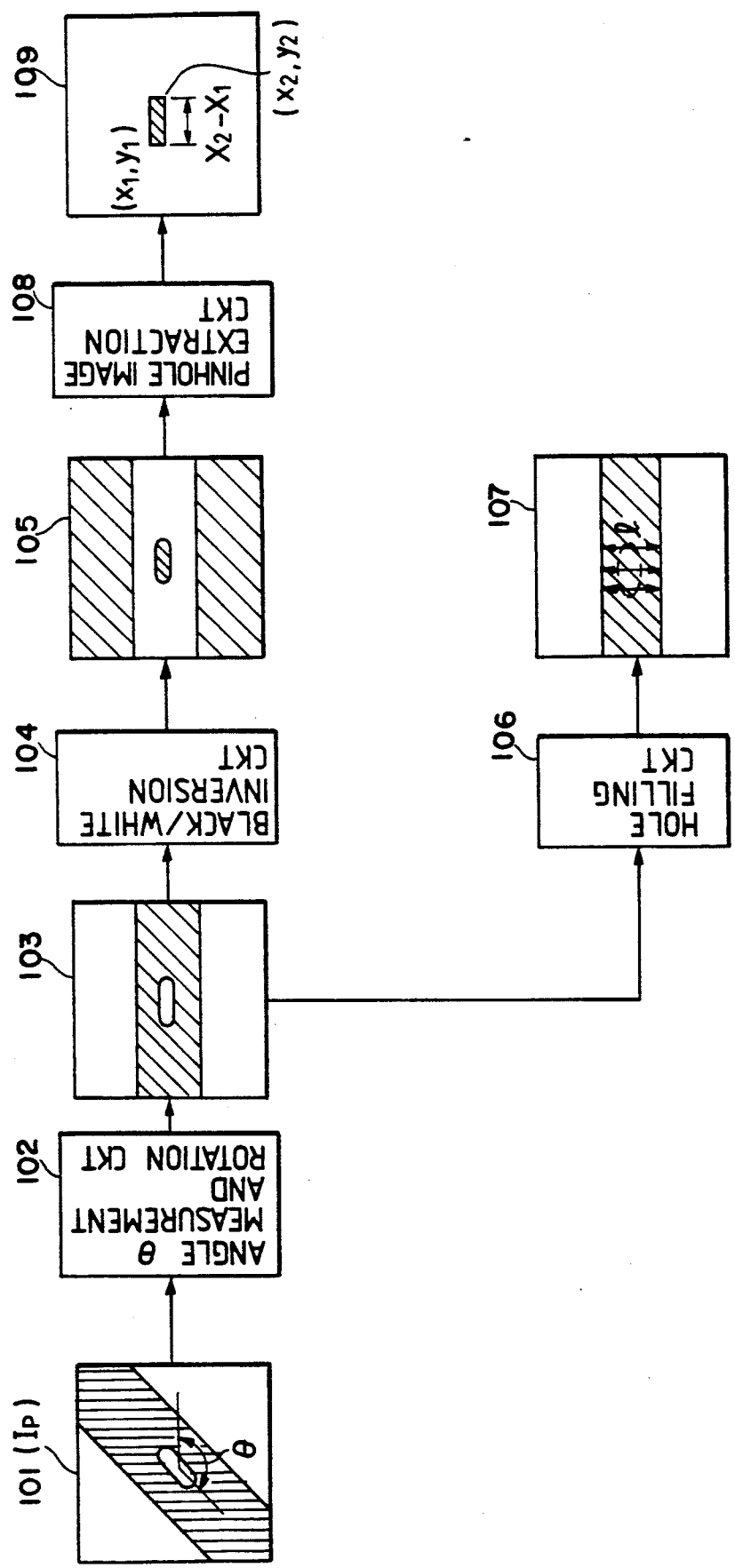

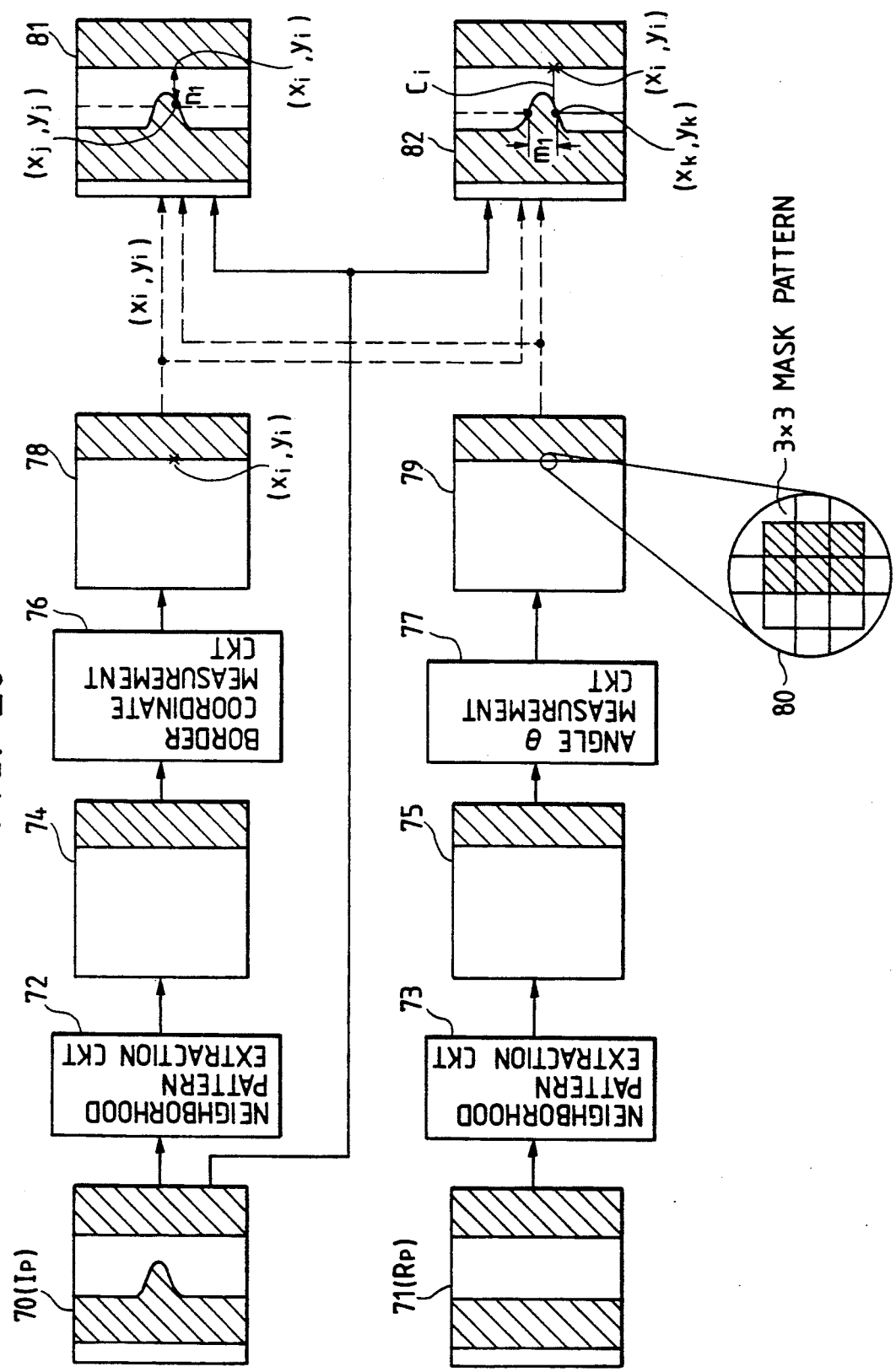

METHOD OF INSPECTING DEFECTS IN CIRCUIT PATTERN AND SYSTEM FOR CARRYING OUT THE METHOD

BACKGROUND OF THE INVENTION

The present invention relates to a method and system for automatically inspecting through image processing, a defect or a plurality thereof existing in an electronic circuit wiring pattern such as a printed circuit board pattern, a circuit pattern on a ceramic substrate, a circuit pattern of a hybrid integrated circuit, a circuit pattern of electrodes for facsimile machine, a thin film circuit pattern, a circuit pattern for a liquid crystal display device, a circuit pattern of a large scale integrated circuit and so forth.

There are a variety of conventional systems for the inspection of the external appearance of a circuit pattern. Disclosed in Japanese Patent Application Publication No. 59-24361 is one example, wherein two circuit patterns are compared with each other, and a part of one circuit pattern discriminated different from the other circuit pattern is detected as a defect. To meet the requirement of circuit pattern defect inspection calling for high speeds, a circuit pattern comparison circuit incorporated in the above example is arranged to be capable of comparing two circuit patterns with each other at a rate synchronizing with that of an imaging device or a pattern detector. More precisely, the above-quoted example comprises a logic circuit called a pipeline processing circuit with many shift registers involved.

SUMMARY OF THE INVENTION

Use of the above example system of the prior art enables the pipeline processing to undertake high-speed imaging, but fails to assume complex image processing. Thus high-speed sophisticated circuit pattern examination is not possible with the above-quoted example system.

It is an object of the present invention to provide a circuit pattern defect inspecting method and system capable of examining, through image processing, complex circuit pattern defects harmful to electrical conductivity which have in the past been identified via visual observations by an inspector.

The above object is accomplished according to the present invention by providing a method of inspecting a defect in a circuit pattern, which includes imaging the circuit pattern to be inspected so as to produce an image signal representing the circuit pattern; comparing the image signal with a reference image signal; detecting a candidate defect within the circuit pattern, at a rate synchronized with the rate of imaging, following the consequence of the comparison; extracting a local image signal which corresponds to a local image covering a region including every one of the detected candidate defects and storing the local image signal in a memory device; and reading out the local image signal from the memory device to examine whether or not each of such candidate defects is fatally harmful to electrical conductivity at a rate asynchronous with the imaging rate.

BRIEF DESCRIPTION OF THE DRAWINGS

In the accompanying drawings:

FIGS. 8 and 9 show the profiles of respective defects, some of which are harmful to electrical conductivity and the rest of which are not;

FIGS. 12 through 23 show respective algorithms to device whether or not respective candidate defects are harmful in respect of electrical conductivity, according to the present invention.

DETAILED DESCRIPTION OF EMBODIMENTS

Figure 1:
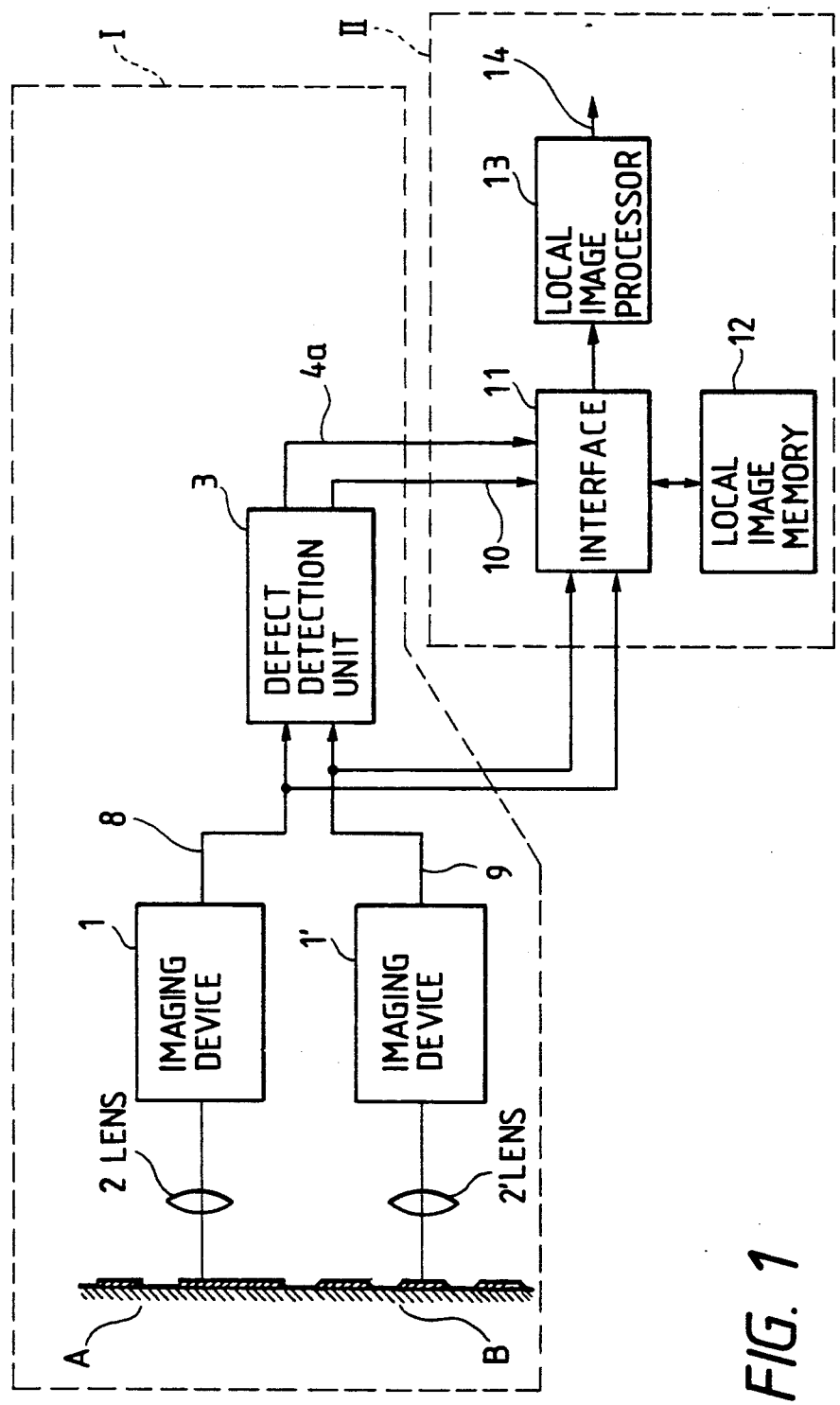
FIG. 1 is a block diagram of a first embodiment of the system implementing the method of the present invention.

Embodiments of the present invention which are presented in the drawings are illustrated hereunder.

Figure 2:
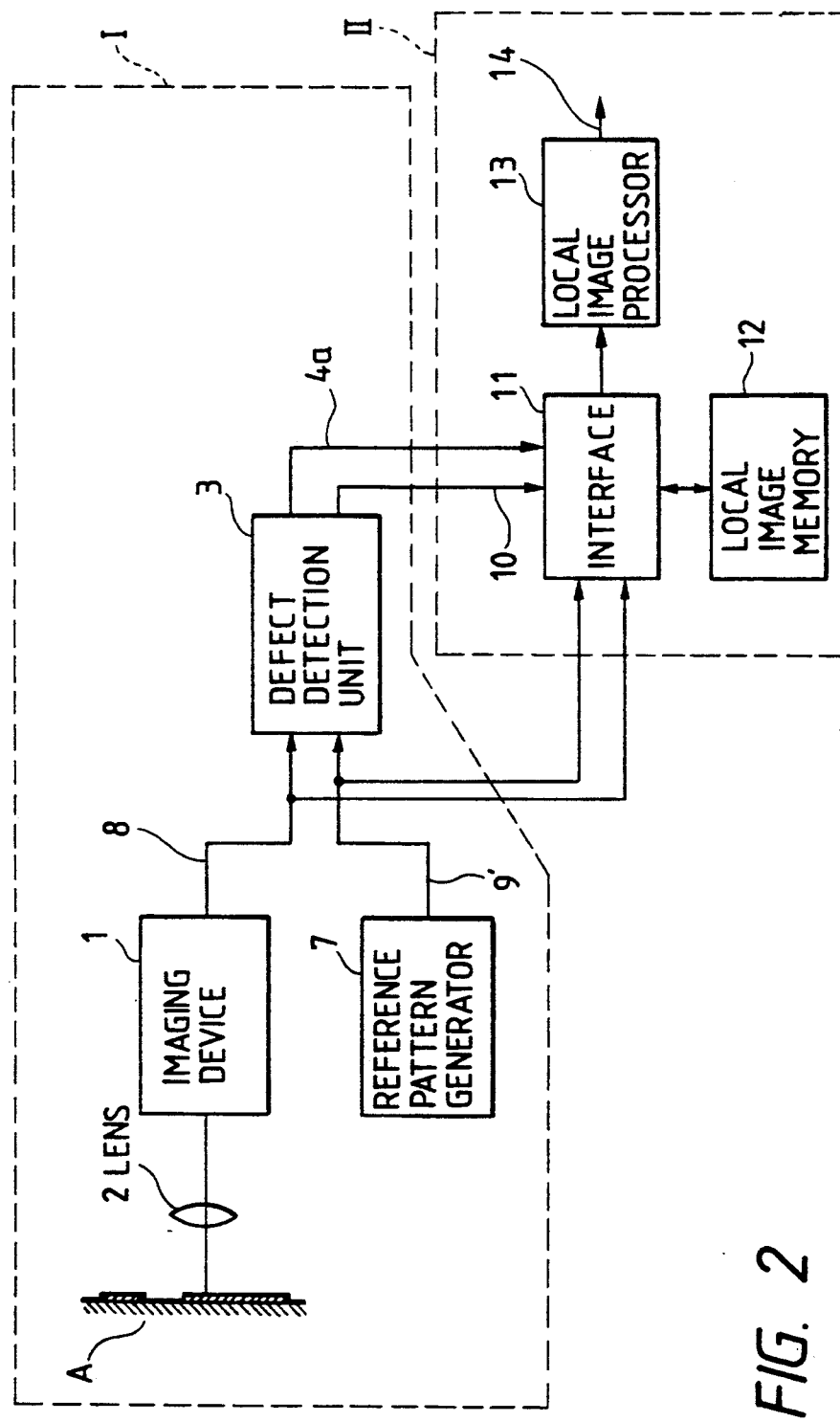
FIG. 2 is a block diagram of a second embodiment of the system implementing the method of the present invention.
Figure 3:
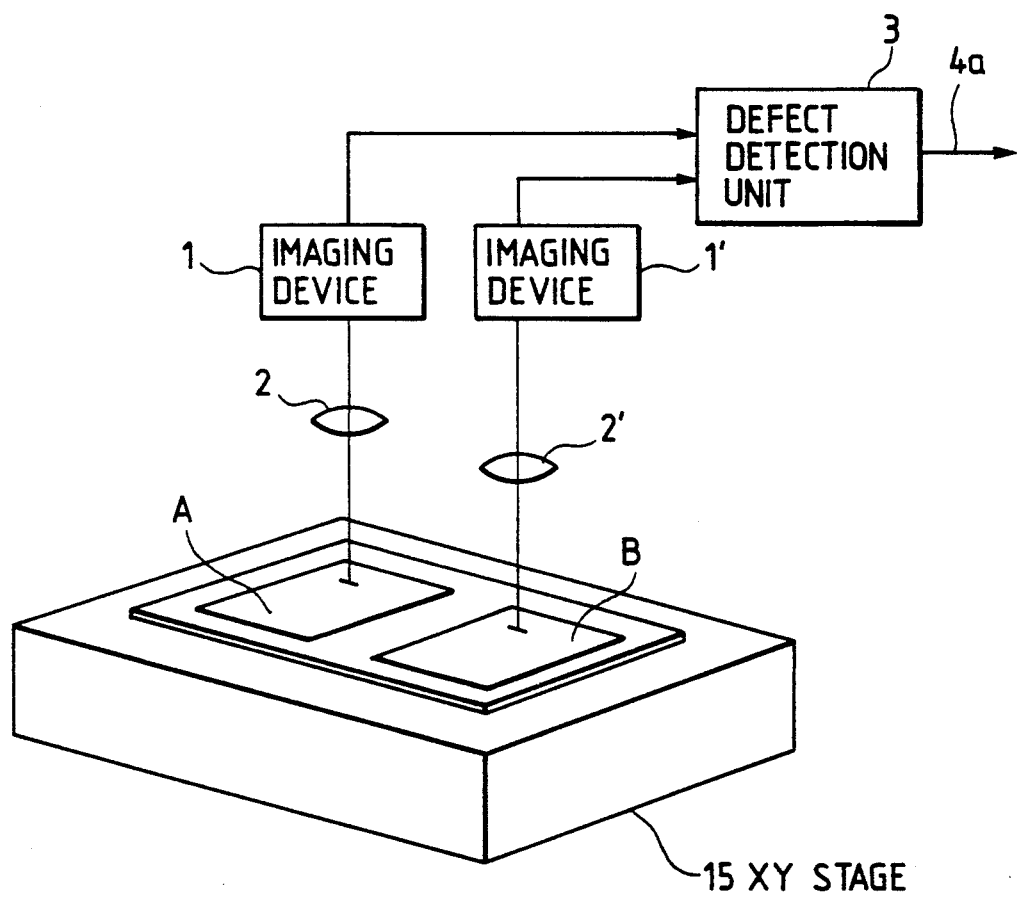
FIG. 3 is a block diagram of an example of a conventional circuit pattern defect inspecting system.

First, referring to FIGS. 1 and 2, a principle of the present invention is described. In a circuit pattern inspection system I marked off with a dotted line in FIG. 1, the image signals output respectively from imaging devices or pattern detectors 1 and 1' are processed by a defect detection unit 3 thereby to detect a candidate detect. The imaging devices or pattern detectors 1 and 1' in FIG. 1 are of a CCD linear image sensor or a photoelectric converter of a scanner type wherein a laser light beam spot is scanned and the reflected light thereof is detected. Normally, a circuit pattern A to be inspected and a reference circuit pattern B are set on a common XY stage 15, shown in FIG. 3, and a part of the former circuit corresponding to an counterpart of the latter is detected respectively by the imaging devices 1 and 1'. In FIG. 1, the XY stage 15 and an illuminator are omitted from being presented. The circuit pattern inspection system I may be of a different configuration other than that shown in FIG. 1. Namely, as shown in FIG. 2, the circuit pattern inspection system may otherwise comprise one imaging device or pattern detector 1, a reference pattern generator 7 and a defect detection unit 3 (quoted in the 1973 convention of the Institute of Electrical Engineers of Japan, paper No. 1347).

The circuit pattern inspection system I marked off with a dotted line in FIG. 2, processes an image signal 8 output from the imaging device or pattern detector 1, and a reference image signal 9' given forth from the reference pattern generator 7 by the defect detection unit 3. By the above procedure a candidate defect is detected. The reference pattern generator 7 may be of such a configuration (as disclosed in Japanese patent application laid-Open No. 62-247478 and corresponding U.S. Pat. No. 4,908,871, for example) wherein a compressed image of a certain reference circuit pattern is stored previously in a circuit pattern memory unit so that the reference circuit pattern will be generated therefrom. There is also available another reference pattern generator which generates the reference circuit pattern, following the design data applied to depict a circuit pattern (as illustrated on A Collection of Papers by the Members of Japanese Instrumentation Automatic Control Society, Vol. 20, No. 12, pp. 63-70, for example).

The present invention is characterized in that, as shown in FIGS. 1 and 2, the circuit pattern inspection system I is combined with a local image inspection system II so that sophisticated inspections may be performed, no matter how the circuit pattern inspection system I is configured. Various well known configurations capable of being used in the circuit pattern inspection system I are shown in U.S. pat. Nos. 4,148,065 to Nakagawa, et al. and U.S. Pat. No. 4,421,410 to Karasaki and the article "Automatic Inspection System For Printed Circuit Boards", by Yasuhiko Hara, et al, IEEE Transactions ON Pattern Analysis and Machine Intelligence, Volume PAMI-5, No. 6, November 1983, pgs. 623-630. In the local image inspection system II, a local image processor 13 has its own image memory, whereby it is practicable that the signal of each image (comprising 256×256 pixels, for example) written previously in the image memory is read out optionally for image processing. Additionally, the image signal, through the image processing can be written into the image memory in a repetitive manner, thus allowing sophisticated image processing. Though the algorithm for each individual image processing is programmable, a certain type of local image processor may fabricate the algorithm, using a logic circuit (part of the algorithm is set up with a pipeline processor circuit) for high-speed image processing. One embodiment of the local image processor 13 is disclosed in the Hitachi Hyoron, Vol. 70, No. 7 (July 1988), pp. 69-75.

In the circuit pattern inspection system I presented respectively in FIGS. 1 and 2, high-speed image processing is feasible with the time required for defect detection and image processing per one pixel decreased as short as approximately 1 $\mu$s (clock frequency $F_0=10$ MHz). However, as the local image processor 13 is able to undertake the processing of an image comprising $256 \times 256 = 6.6 \times 10^4$ pixels over a period of approximately 0.1 second, the time necessary to process a single pixel image is around $0.1/(6.6 \times 10^4) =$ approximately 1.5 $\mu$s. Thus, with an interface 11 applied, a local image signal corresponding to the periphery of the candidate defect involved is extracted from the image signal output from the circuit pattern inspection system I. Successively, the local image signal thus extracted is written into a local image memory 12, and thereafter, the local image signal thus written into the local image memory is input to the local image processor 13 for sophisticated image processing, whereby the candidate defect is examined for fatally harmful flaws.

Figure 4:
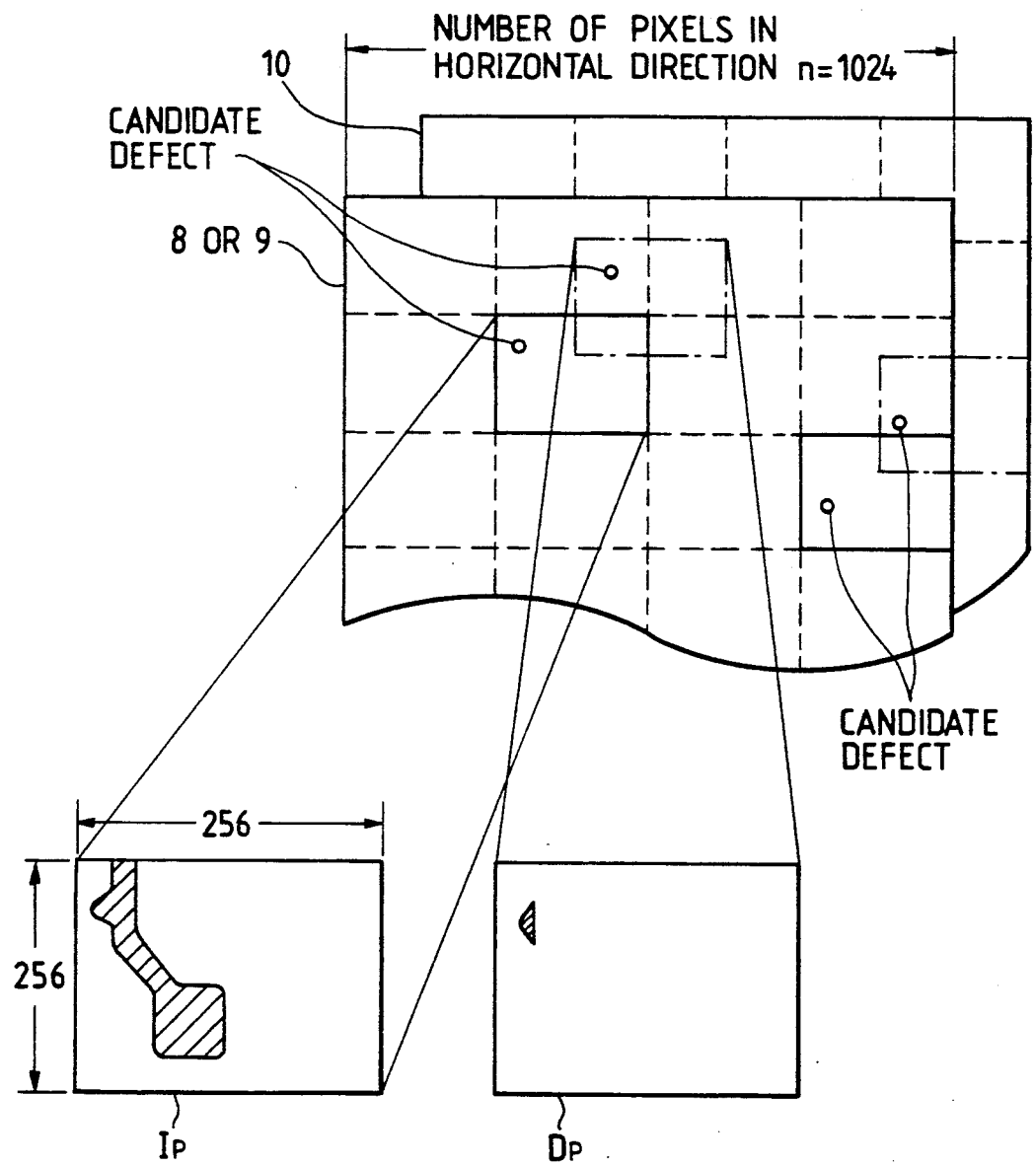
FIGS. 4 through 7 show circuit pattern image signals reference circuit pattern image signals and defect circuit pattern image signals, and local image signals corresponding to each of above-mentioned signals, respectively.

FIG. 4 gives an outline of loading into the local image memory 12 a local image signal Ip extracted from either the image signal 8 or the image signal 9, and a local image signal Dp extracted from a defect pattern image signal 10 output as a result of image processing done by the defect detection unit 3. Assuming that the number of pixels detectable in one scanning line of the imaging devices 1 and 1' is 1024, the number of pixels n in the horizontal direction respectively of the image signal 8 of a circuit pattern A, the image signal 9 of a reference circuit pattern, and the image signal 10 of a defect pattern is 1024. Of these, the local image signals Ip and Dp, each corresponding to a square local image comprising N×N pixels (N=256 for example) covering a candidate defect, are loaded into the local image memory 12 for storage therein. It is noted that as the local image signal Ip, a local image signal extracted from the circuit pattern image signal 8, and a local image signal from the reference circuit pattern image signal 9 are written into the local image memory 12. Or the local image signal Ip corresponding to the local image including a candidate defect and which is out of the circuit pattern image signal 8 and reference circuit pattern image signal 9 is loaded into the local image memory 12 for storage therein.

Figure 5:
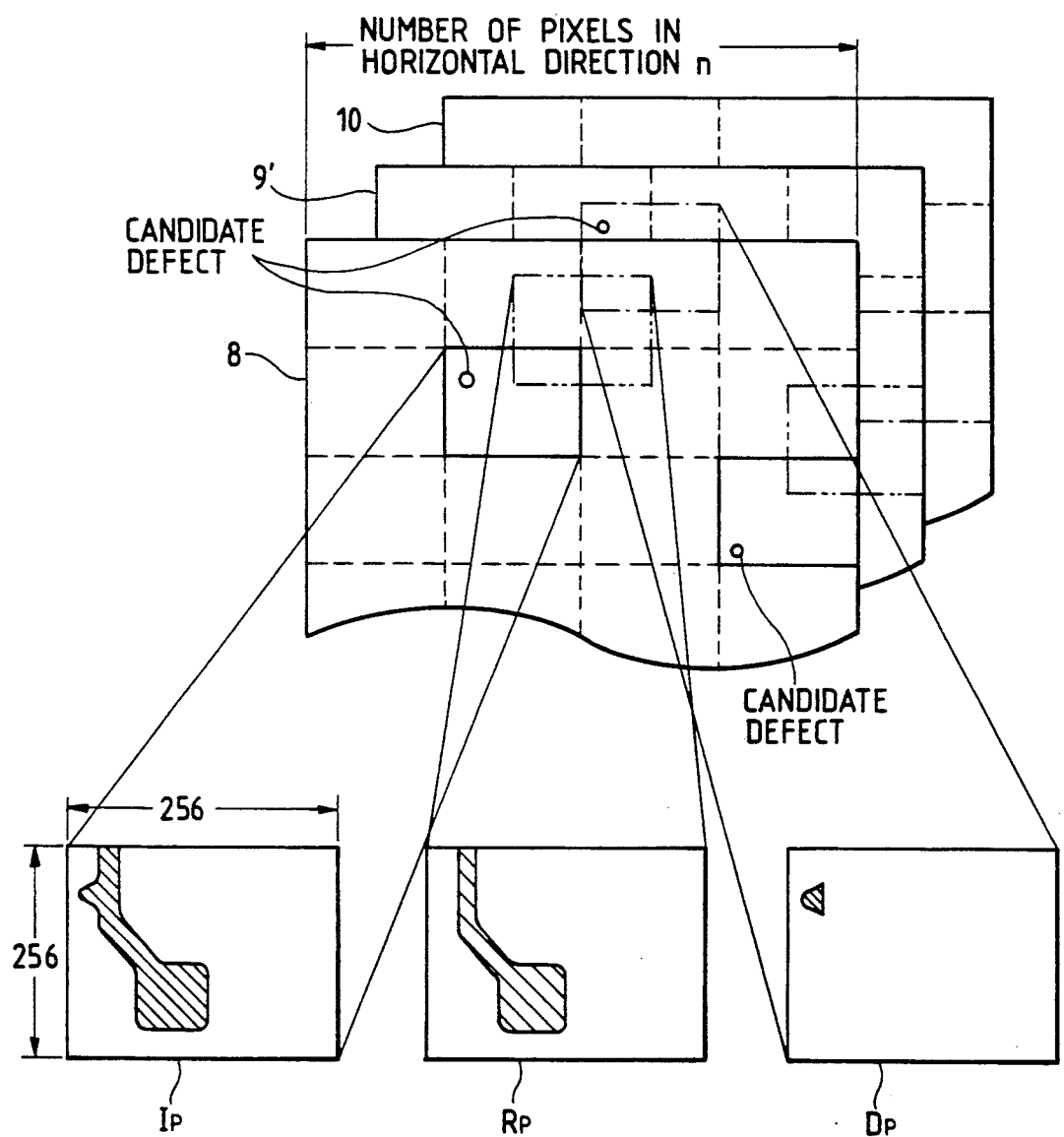

FIG. 5 illustrates an outline of writing into the local image memory 12, of the local image signal Ip extracted from the circuit pattern image signal 8 output from the imaging device, a local image signal Rp from a reference circuit pattern image signal 9' given forth by the reference pattern generator 7 and the local image signal Dp from the defect pattern image signal 10, which the defect detection unit 3 outputs as a result of image processing, shown respectively in FIG. 2. Where the reference pattern generator 7 generates a reference circuit pattern comprising the same number of pixels as that in one scanning line of the imaging device 1 in FIG. 2 and which is assumed as being 1024, the number of pixels n in the horizontal direction is commonly 1024 with the circuit pattern image signal 8, the reference circuit pattern image signal 9', and the defect pattern image signal 10. Of these, the local image signals Ip, Rp, Dp, each representing a square local image comprising N×N pixels (n=256 for example) including the coordinate point of a candidate defect are loaded into the local image memory 12 in FIG. 2. Where there are a plurality of candidate detects, plural local image signals Ip, Rp, and Dp are written into the local image memory 12 for storage therein.

Figure 6:
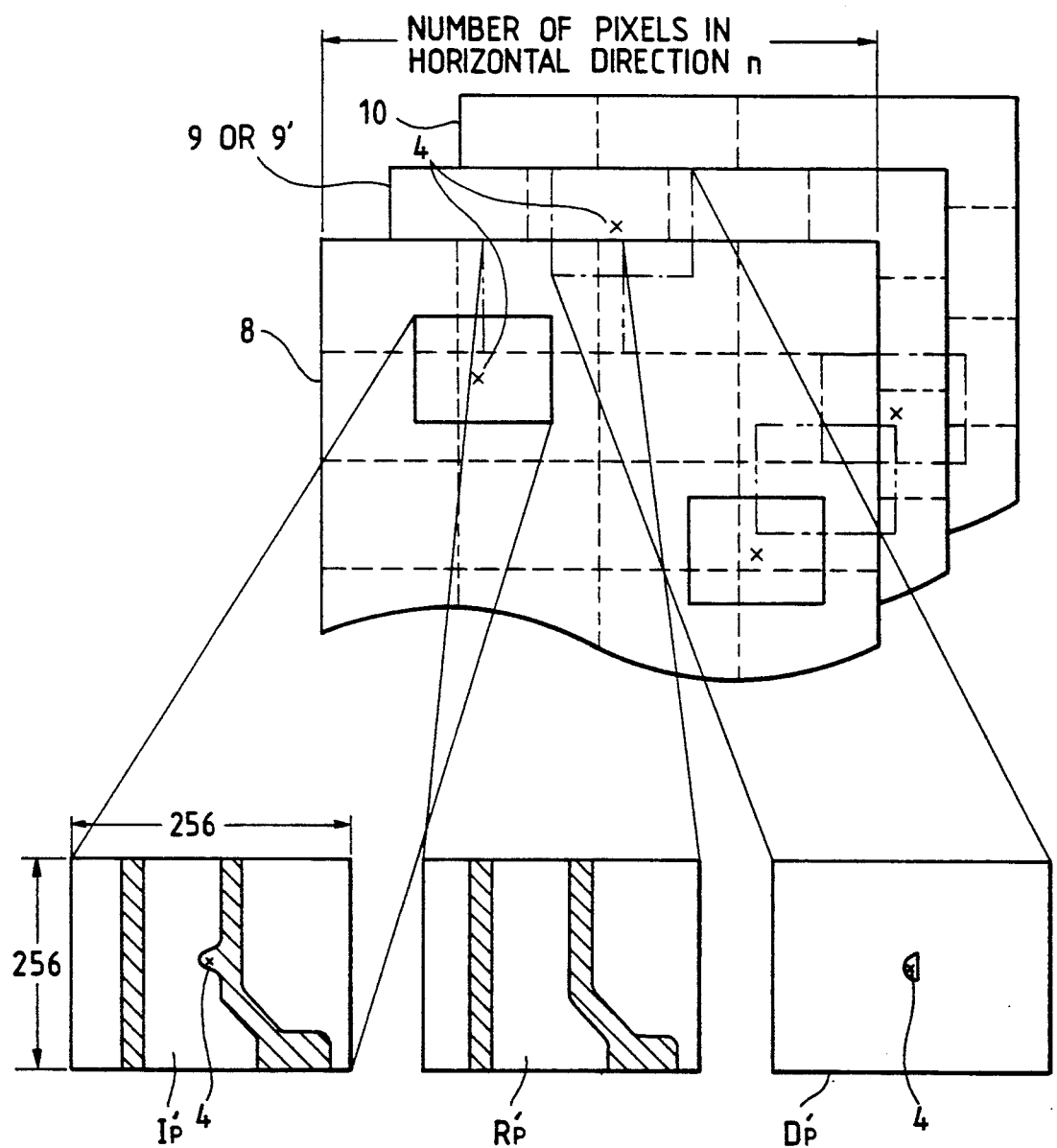

Presented in FIG. 6 is an improved method of storing the local image signals in FIG. 5 into the local image memory, wherein each of local image signals Ip', Rp' and Dp' of the respective candidate defects is stored in the local image memory 12 including coordinates of a point 4 designating a candidate defect.

Figure 7:
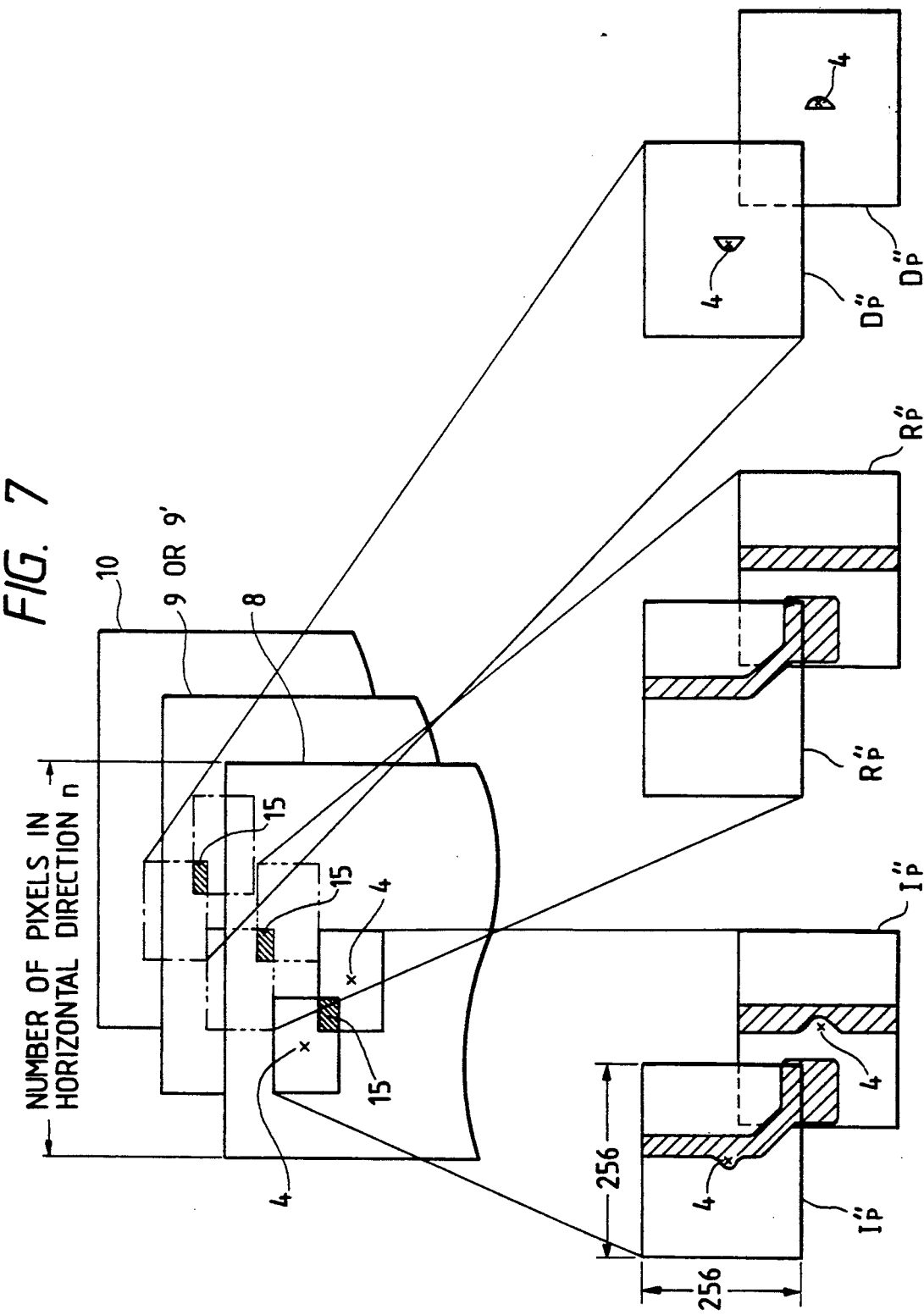

FIG. 7 gives another improved method of storing the local image signals in FIG. 6 into the local image memory 12, wherein also when there are plural candidate defect designation points 4 in proximity to each other, local image signals Ip", Rp", and Dp" with overlapped areas 15 are loaded into the local image memory 12 for storage therein.

Next, how the local image processor 13 examines whether or not the candidate defect concerned is fatally harmful is described. FIGS. 8 and 9 show the respective candidate defects, one of which was examined harmful, and the other was which was ascertained unharmful to electrical conductivity of one circuit pattern. FIG. 8 (i) illustrates a case where there lies a candidate defect at the periphery of a line circuit pattern; in this case if a length of $v_1$ of a mouse bit which takes the form of an indent or an intrusion in the longitudinal direction of the circuit pattern concerned is larger than the reference value of an inspection standard, the mouse bit is decided as being fatally harmful. However, when the length $v_1$ is less than the reference value, the mouse bit is not determined to be fatally harmful. Given in FIG. 8 (ii) is another case in which there exists a pinhole in the line circuit pattern, and wherein if a length of $v_2$ of the pinhole in the longitudinal direction of the line circuit pattern is larger than the reference value of the inspection standard, the pinhole is judged as being fatally harmful. Meanwhile when the pinhole length is smaller than the reference value, the pinhole is not decided to be fatally harmful. Presented in FIG. 8 (iii) is a case where the line circuit pattern has a spur or extrusion in its periphery, and wherein if a minimum inter-circuit pattern gap of $n_1$ between a normal circuit pattern in the neighborhood of the line circuit pattern and the spur or extrusion is less than the reference value prescribed by the inspection standard, it draws a judgement that the spur or extrusion is fatally harmful. Meanwhile when $n_1$ is greater than the reference value, it concludes that the nick is not fatally harmful. FIG. 8 (iv) shows a case in which a certain circuit pattern has a copper splash, or isolation defect and wherein if a minimum inter-circuit pattern gap of $n_2$ between the copper splash or isolation defect and a normal circuit pattern is smaller than the reference value of the inspection standard, the copper splash is determined as being fatally harmful. On the other hand, when $n_2$ is greater than the reference value, the copper splash draws a judgement that it is not fatally harmful. Illustrated in FIG. 9 (v) is a case in which a large circuit pattern has mouse bits, and wherein if the total area $\Sigma S_i$ of the mouse bits is greater than the reference value of the inspection standard, the mouse bits are decided to be fatally harmful. Meanwhile when $\Sigma S_i$ is lesser than the reference value, the mouse bits draw a conclusion that they are not fatally harmful. FIG. 9 (vi) gives a case in which a large circuit pattern contains pinholes, and wherein if the total $\Sigma l_i$ of the maximum diameters of the respective pinholes is greater than the reference value prescribed by the inspection standard, these pinholes are regarded to be fatally harmful. Meanwhile when $\Sigma l_i$ is lesser than the reference value, these pinholes are determined as being not fatally harmful. Finally, presented in FIG. 9 (vii) is a case where a certain circuit pattern has a nick thereon and wherein if the inter-circuit pattern gap $n_3$ between a nearby normal circuit pattern and the nick is less than the reference value of the inspection standard, the nick draws a judgement that it is fatally harmful; on the other hand, when $n_3$ is larger than the reference value, the nick is decided to be not fatally harmful.

The inspection system I is not capable to discriminate fatally harmful and non-fatally harmful defects from each other which are shown respectively in FIGS. 8 and 9. Thus with the inspection system I, the operator involved has so far been obliged to manually discern fatally harmful defects from non-fatally harmful defects through his careful observations of every one of candidate defects so pointed out by the inspection system I.

With regard to the case presented in FIG. 8 (i), the present invention distinguishes a fatally harmful defect from a non-fatally harmful defect via measurement of $t_1$ and $v_1$ of each candidate defect with the local image processor 13. In the meantime, as regards the case in FIG. 8 (ii), a discernment between a fatally harmful defect and a non-fatally harmful defect is implemented through measurement of not only $t_2$ but also $v_2$ of every suspect defect. As for the case in FIG. 8 (iii), a distinction between a fatally harmful defect and a non-fatally harmful defect is practiced by way of measuring $m_1$ and $n_1$ of each candidate defect. With reference to the case in FIG. 8 (iv), measurement of p and $n_2$ of every candidate defect allows the device to discern a fatally harmful defect from a non-fatally harmful defect. Meanwhile, in respect of the case in FIG. 9 (v), measuring $\Sigma S_i$ of candidate defects is done to distinguish between a fatally harmful defect and a non-fatally harmful defect. Concerning the case in FIG. 9 (vi), measuring $\Sigma l_i$ of candidate defects is done to discriminate between fatally harmful and non-fatally harmful defects. Finally with regard to the case in FIG. 9 (vii), a fatally harmful defect and a non-fatally harmful defect are distinguished from each other by measuring $m_2$ and $n_3$ of every candidate defect.

With the present invention, a combination of the inspection system I and a local image inspection system II as shown respectively in FIGS. 1 and 2 enables examination of candidate defects at the same high speed as that of the inspection system I, and at the same time the further provision of the local image processor 13, characterized by a precision image processing capability, provides the capability of discerning between fatally harmful and non-fatally harmful defects specified respectively in FIGS. 8 and 9. More precisely with this, individual circuit patterns are examined according to the inspection system I to detect a candidate defect in each circuit pattern. The defect detection unit 3 outputs a candidate defect designation point signal 4a whenever it detects a candidate defect. The candidate defect designation point signal 4a is an output signal indicating that a certain circuit pattern is found with the whole categories of candidate defects inclusive of both fatally harmful and non-fatally harmful defects quoted in FIGS. 8 and 9.

In a system according to the present invention, the candidate defect designation point signal 4a is utilized as illustrated hereunder. Namely, use of the candidate defect designation point signal 4a as a control signal to store the local image signals Ip, Rp, and Dp results in enabling to store into the local image memory 12 a local image of the neighborhood area of each candidate defect designation point 4 (see FIG. 6) shown in FIGS. 8 and 9. Through processing the local image of each candidate defect by use of the local image processor 13, the candidate defect goes through a discernment examination as to whether or not it is fatally harmful in respect of electrical conductivity as exemplified in FIGS. 8 and 9.

The inspection system I configured in the system of the present invention is enabled to undertake examining at a high speed the entire surface of each circuit pattern to undergo inspection. The size of a certain circuit pattern to be inspected is assumed here as 300×600 mm, and the pixel size for detection is likewise presumed to be 0.01 mm. The number of pixels subjected to image processing in this case is $300 \times 600/(0.01 \times 0.01) = 1.8 \times 10^9$. Further assuming that the time required for detection and image-processing a single pixel is 0.1 μs, the total time required for the inspection system I to examine the entire area of the circuit pattern is calculated as $1.8 \times 10^9 \times 10^{-7} = 180$ (s). Where one printed circuit board contains 10 candidate defects in its circuit pattern, the local image processor 13 processes the local image signal of each candidate defect, consuming a mean inspection time of 180 (s)/10=18 (s) to determine whether or not the candidate defect is fatally harmful. The inspection system configured such as the above is allowed to not only exhibit a high-speed performance of the inspection system I (a pipeline type image processor) but also makes well use of a precision image processing capability of the local image processor 13. Further with the inspection system according to the present invention, it becomes practicable to match a defect discrimination standard of automatic inspection to the standard set up for manually done visual check.

Next, the embodiment of the present invention is further detailed hereunder. The embodiment has the inspection system I and the local image processor 13 configured respectively with a known inspection system and a known image processor applied. In this regard, the interface 11 between the inspection system and local image processor 13 is noted for its technical significance as a hardware circuit.

Figure 10:
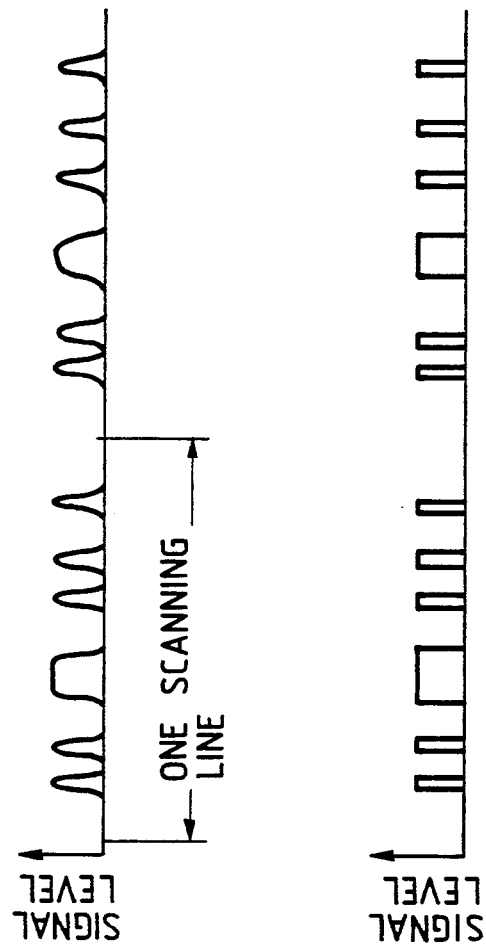
FIGS. 10 (a) and 10 (b) present an image signal delivered out of an imaging device and a binary sampled image signal thereof, respectively.

Now, how the interface 11 is configured is described. With reference to FIGS. 1 and 2, the circuit pattern image signal 8 which is input to the interface 11 from the imaging device or pattern detector 1 is a binary sampled time-sequential signal as shown in FIG. 10 (b) and that is obtained through binary coding of a time-sequentially scanned signal as shown in FIG. 10 (a) by a threshold circuit (omitted from being presented in FIGS. 1 and 2). In addition, the reference circuit pattern image signal 9 or 9' which is input to the interface 11 is a binary sampled image signal from the imaging device or pattern detector 1' shown in FIG. 1, or is a binary sampled time-sequential signal from the reference circuit pattern generator 7 shown in FIG. 2. The defect circuit pattern image signal 10 input to the interface 11 from the defect detection unit 3 is a time-sequentially scanned signal which is obtained through processing the circuit pattern image signal 8 and the reference circuit pattern image signal 9 or 9'.

Figure 11:
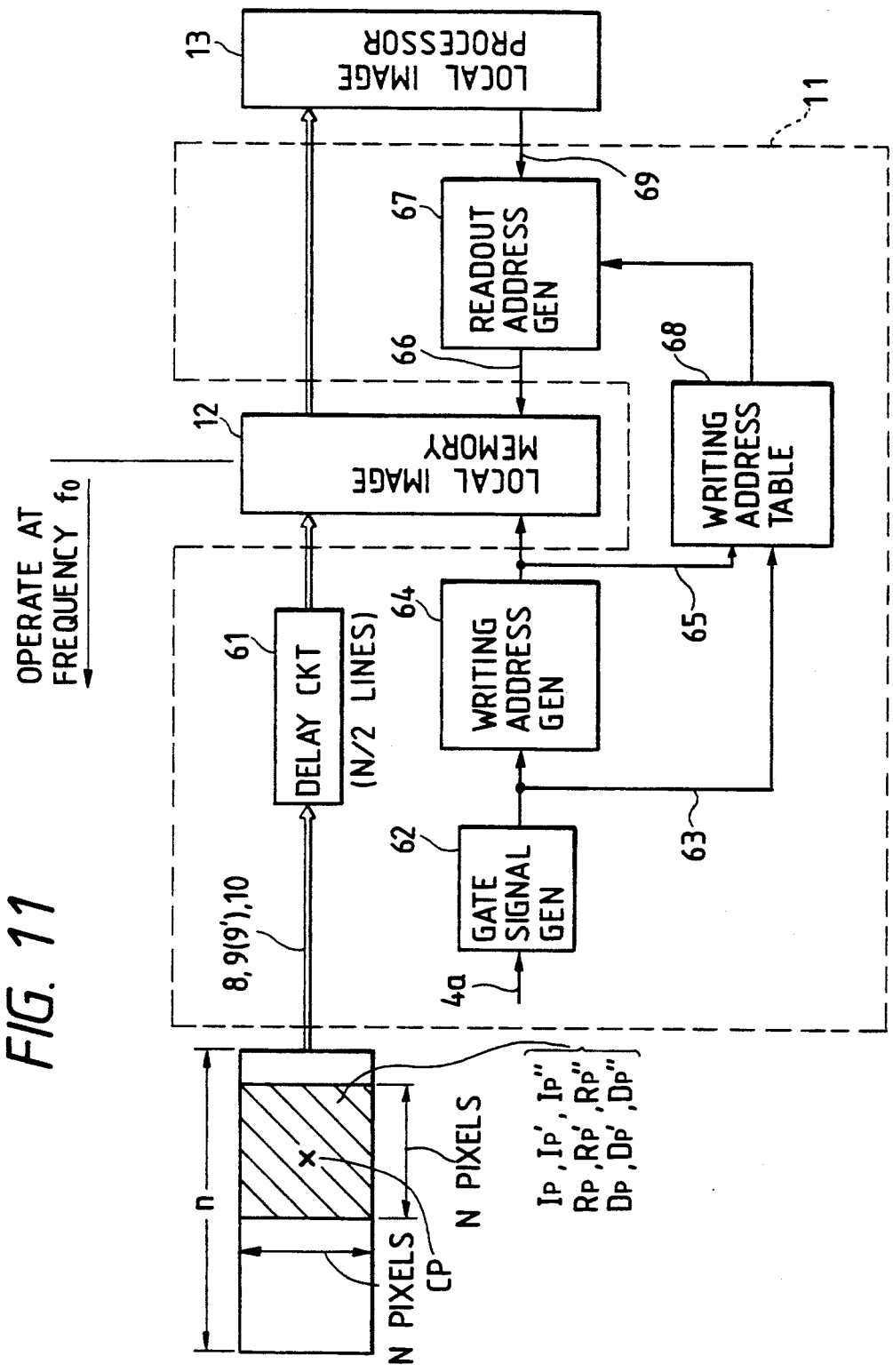
FIG. 11 is a block diagram showing an example of an interface shown in FIGS. 1 and 2.

Presented in FIG. 11 is one example of the interface 11, wherein it is shown that the circuit pattern image signal 8, the reference circuit pattern image signal 9 or 9' and the defect circuit pattern image signal 10, each of which is made up of n pixels, n=1024 for example, in the horizontal direction, are input to the interface circuit 11. Using the candidate defect designation point signal 4a, the local image signals Ip (Ip', Ip''), Rp (Rp', Rp''), and Dp (Dp', Dp''), each made up of N×N pixels (N=256 for example) are stored into the local image memory 12. FIG. 11 further shows that the local image memory, 12 in which the local image signals Ip (Ip', Ip''), Rp (Rp', Rp''), and Dp (Dp', Dp'') have previously been stored, are subsequently input to the local image processor 13 (provided, the operational procedure referred to above is identical with each of the local image signals Ip, Rp, and Dp; in view of this, one instance of a circuit used to store one local image signal into and read out from the local image memory is presented in FIG. 11).

The candidate defect designation point signal 4a from the defect detector unit 3 provides a pulse at the time $t_0$ at which the defect detection unit 3 finds out a candidate defect. With this in view, and to extract a partial image to be included in each local image made up of N×N pixels prior to the timing $t_0$, both the circuit pattern image signals 8, 9 (9') and the defect circuit pattern image signal 10 are delayed by a delay circuit 61 as much as corresponds to the time equivalent to n/2 scanning lines. Meanwhile, the candidate defect designation point signal 4a is input to a gate signal generator 62, whereby according to the candidate defect designation point signal 4a, a gate signal 63 remaining on for a period as long as is equivalent to the time required for scanning N pixels is repeatedly generated for as many as N scanning lines. Generating a writing address signal 65 from a writing address generator 64 over a gate serviceable period makes it practicable to store in the local image memory 12 each circuit pattern image comprised of N×N pixels which are located around the coordinates of a candidate defect designation point 4a. The above step is carried out at a high speed synchronous with the scanning rate of the imaging device or pattern detector 1. The local image memory 12 is so arranged in preparation for the possibility of one circuit pattern containing a plurality of candidate defects that the local image memory 12 can store plural local image signals Ip'', Rp'' and Dp''.

Next, the local image signals Ip, Rp, and Dp which have been stored into the local image memory 12 are read out therefrom, and are input to the local image processor 13. Since normally, the local image processor 13 is of such a configuration for inputting a TV video signal, the signal of each local image comprising N×N pixels is input into the local image processor 13 at a rate of approximately 1/60 (s). A horizontal synchronizing signal 69 from the local image processor 13 is input to a read out address generator 67, and successively, a read out address signal 66 is output from the readout address generator 67. To force-generate the read out address signal 66, the read out address generator 67 applies the horizontal synchronizing signal as a start signal. Synchronously with the outputting of the readout address signal 66, the local image signals Ip, Rp, and Dp are input to the local image processor 13.

In a situation where a plurality of candidate defect designation points exist in close proximity to another, and wherein the local image signals Ip, Rp, and Dp are thus generated while overlapped with one over another, a writing address table 68 is provided. As it is not allowed that the local image signals Ip, Rp, and Dp which are overlapped with one over another are written into the local image memory 12, each overlapped part image is stored into the local image memory 12 in a certain format in which the overlapped part image is shared commonly by the local image signals Ip, Rp, and Dp. Simultaneously with writing into the local image memory 12, overlapped plural local image signals Ip, Rp, and Dp have their writing addresses 65 loaded into the writing address table 68. Referring to the writing address table 68, each of the local image signals Ip, Rp, and Dp is read out from the local image memory 12.

As in the foregoing, the inspection system I is configured capable of not only detecting each candidate defect designation point at a high speed but also inputting into the local image processor 13 each local image signal representing an area around a detected candidate defect designation point.

Next, the local image signal representing the area around the candidate defect designation point is processed by the local image processor 13 to judge whether or not the detected candidate defect is fatally harmful. Presented in FIG. 1 is one instance showing how a detected candidate defect is examined for fatal harmfulness to electrical conductivity through checking each of the local image signals Ip and Dp given in FIG. 4. First, the detected candidate defect is ascertained as to whether or not the candidate defect lies at the periphery of a line circuit pattern, if it is existing within the line circuit pattern, whether or not it lies at the periphery of a large areal circuit pattern, or if it is situated within the large areal circuit pattern. Next, to decrease the time to discriminate if the candidate defect concerned is fatally harmful, a window is set up for each of the local image signals Ip and Dp (or Ip local image signal only) so that a part of each local image signal may go through image processing. Noting that the defects are categorized in a mouse bit, i.e. indent or intrusion a pinhole, a spur or extrusion, and a copper splash, or isolation defect a detected candidate defect is discerned whether or not it is a pinhole or if it is a copper splash. Following the completion of this step, each detected defect as shown in FIGS. 8 and 9 is examined for fatal harmfulness to electrical conductivity.

FIG. 12 gives an instance wherein a discrimination is made if a detected candidate defect is located at the periphery of a line circuit pattern, it is situated within the line circuit pattern, it lies at the periphery of a large areal circuit pattern or, it is existing within the large areal circuit pattern. Precisely with this case, the local image signal Ip is divided into an image signal vp of the line circuit pattern, and an image signal Vp of the large areal circuit pattern, using a dividing circuit 16. Further, the local image signal Dp is enlarged, using a dilation circuit 17. Successively, the image signal vp of the line circuit pattern, the image signal Vp of the large areal circuit pattern, and an enlarged image signal Lp from the local image signal Dp undergo image processing by a digital image processor 18 including AND circuits 19a and 19b, whereby an image signal 20 of a mouse bit defect and an image signal 21 with no mouse bit defect are obtained.

Figure 13A:
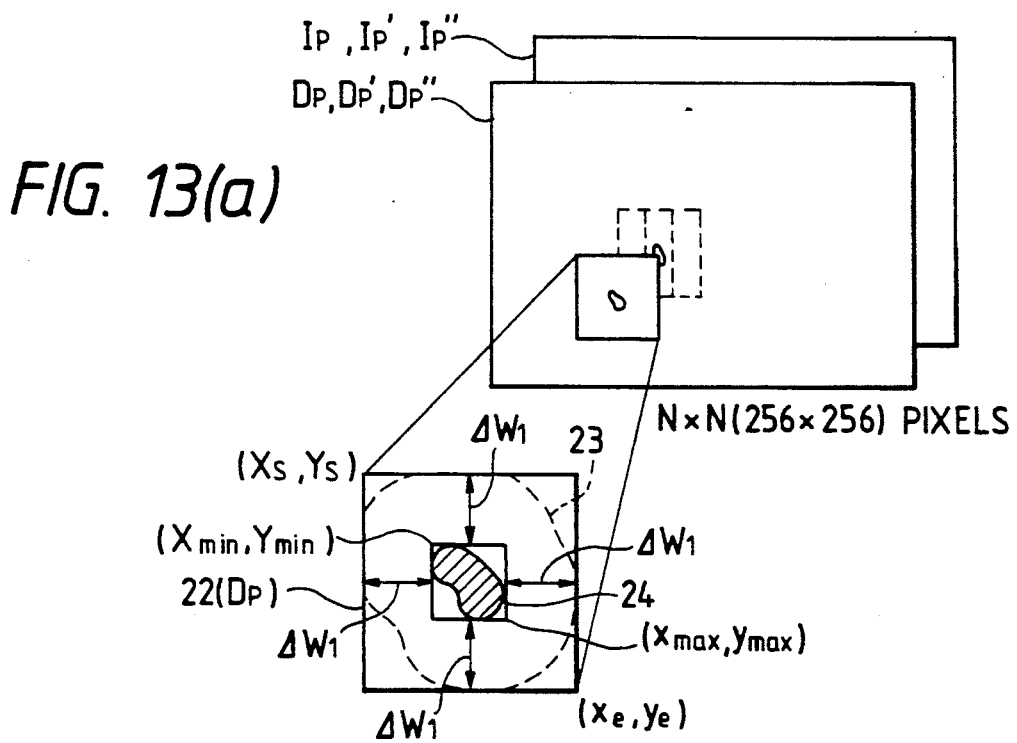
Figure 13B:
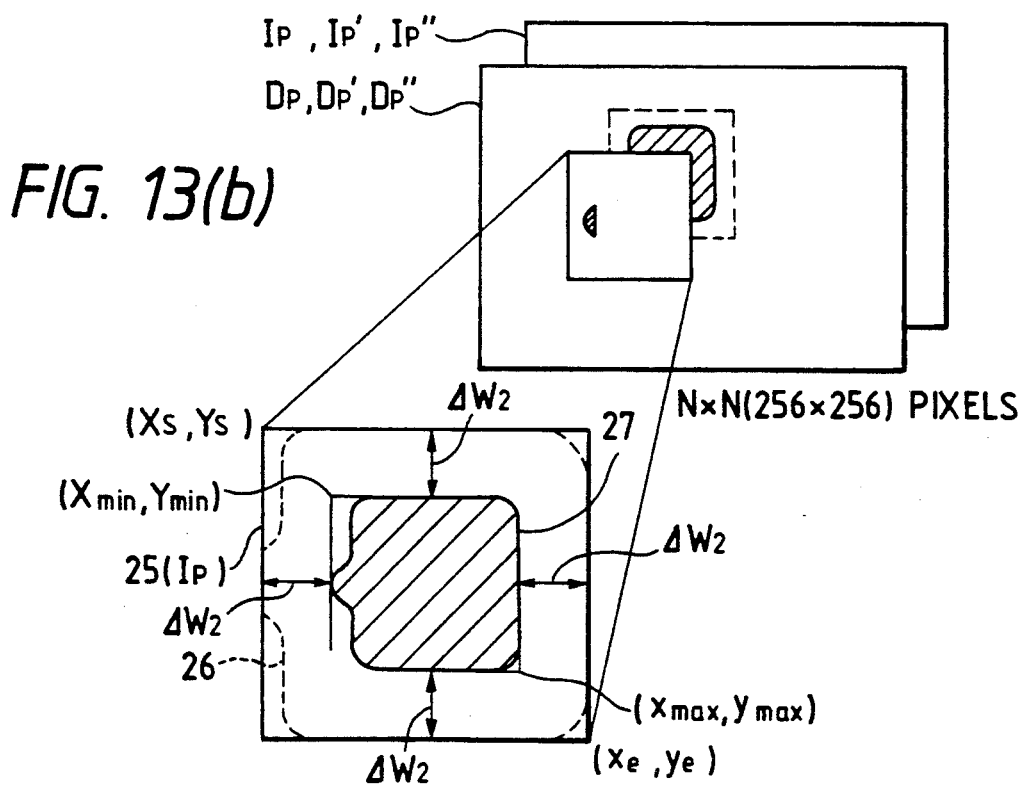

Given in FIG. 13 (a) is one example showing how to set the window where a candidate defect 24 lies at the periphery of the line circuit pattern or within the line circuit pattern. In this example, the respective windows of an identical size are set up at the same positions of the local image signal Ip, Ip' or Ip" and other local image signal Dp, Dp' or Dp". A window 22 has its size and location selected so that a region 23 will be contained therein which has a certain distance from the outline of the candidate defect 24 (the maximum circuit pattern width complying with a reference value of the inspection standard or the minimum inter-circuit pattern gap, whichever is greater). Namely, from the local image signal Dp, Dp' or Dp", the coordinate values (x-min, y-min) and (x-max, y-max) of respective points which the candidate defect has on the diagonals of a defect-contained rectangle within the window are obtained, whereby the respective start points of this rectangle window $xs = x\text{-min} - \Delta w_1$, $ys = y\text{-min} - \Delta w_1$, and the respective end points thereof $xe = x\text{-max} + \Delta w_1$, $ye = y\text{-max} + \Delta w_1$ are calculated. $\Delta w_1$ is a quantity showing a certain distance necessary to decide whether or not the candidate defect is fatally harmful for electrical conductivity, and which refers to the maximum circuit pattern width or the minimum inter-circuit pattern gap, whichever is greater.

FIG. 13 (b) presents another case showing how to set each window where a candidate defect lies at the periphery of a large areal circuit pattern or within the large areal circuit pattern. Precisely with this case, the respective windows of an identical size are set up at the same positions of local image signal Ip, Ip' or Ip" and other local image signal Dp, Dp' or Dp". A window 25 has its size and locations selected to that a region 26 will be contained therein which has a certain distance $\Delta w_2$ (the minimum inter-circuit pattern gap complying with the reference value of the inspection standard) from the outline of the large areal circuit pattern 27. Namely, from a local image signal Ip, the coordinate values (x-min, y-min) and (x-max, y-max) of respective points which the candidate defect has on the diagonals of a large areal circuit pattern-contained rectangle are obtained, whereby the respective starts points of the window $xs = x\text{-min} - \Delta w_2$, $ys = y\text{-min} - \Delta w_2$, and the respective end points thereof $xe = x\text{-max} + \Delta w_2$, $ye = y\text{-max} + \Delta w_2$ are calculated. $\Delta w_2$ is a quantity necessary to determine whether or not the candidate defect concerned is fatally harmful with regard to electrical conductivity and refers to the minimum inter-circuit pattern gap, conforming to the reference value the inspection standard.

Figure 14:
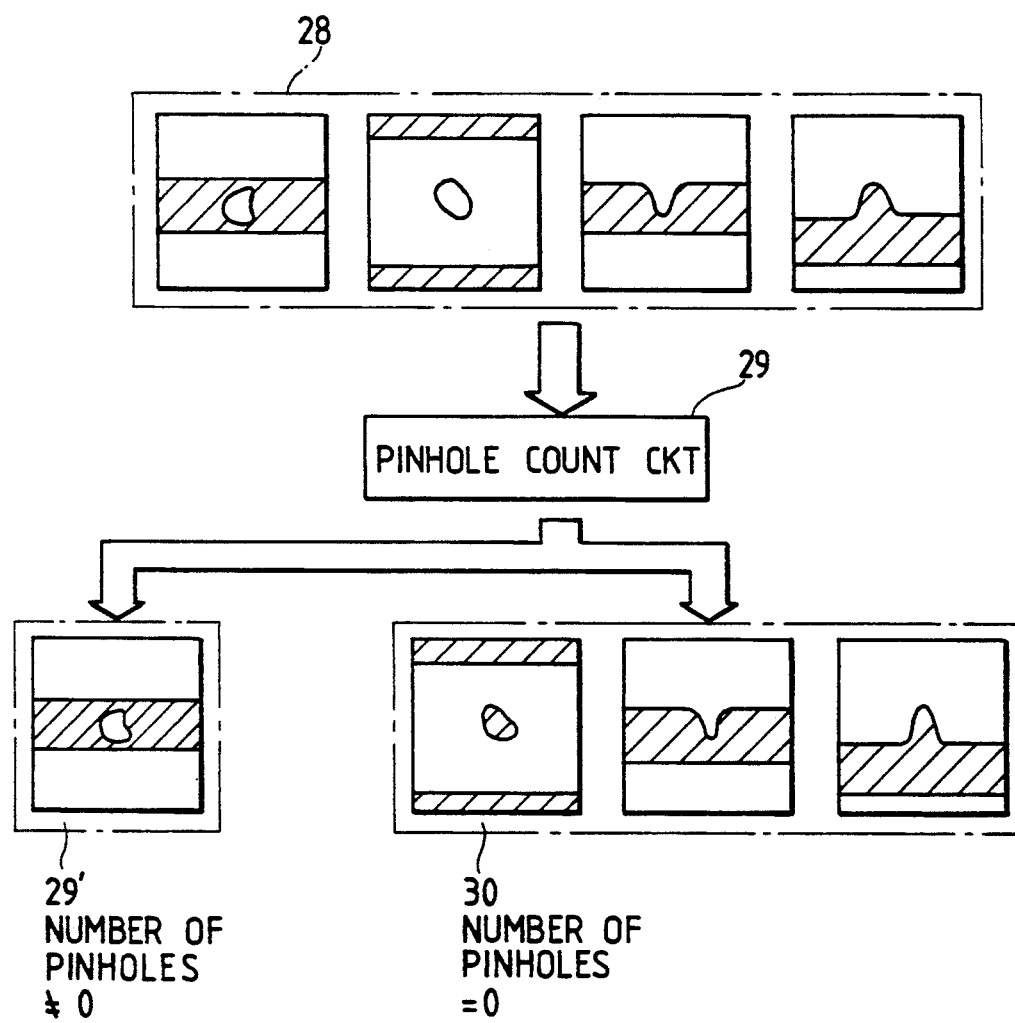

FIG. 14 presents still another instance showing how to determine the candidate defect as being a pinhole, wherein the number of pinholes in respective window interior images 28 of each local image signal Ip, Ip' or Ip" specified respectively in FIGS. 13 (a) and 13 (b) is counted with use of a pinhole count circuit 29; in case the number of pinholes is more than 0 ($\neq 0$) as shown by an image 29', the candidate defect concerned is a pinhole meanwhile when the number of pinholes $= 0$ as shown by images 30, the candidate defect involved is one of the categories other than a pinhole.

Figure 15:
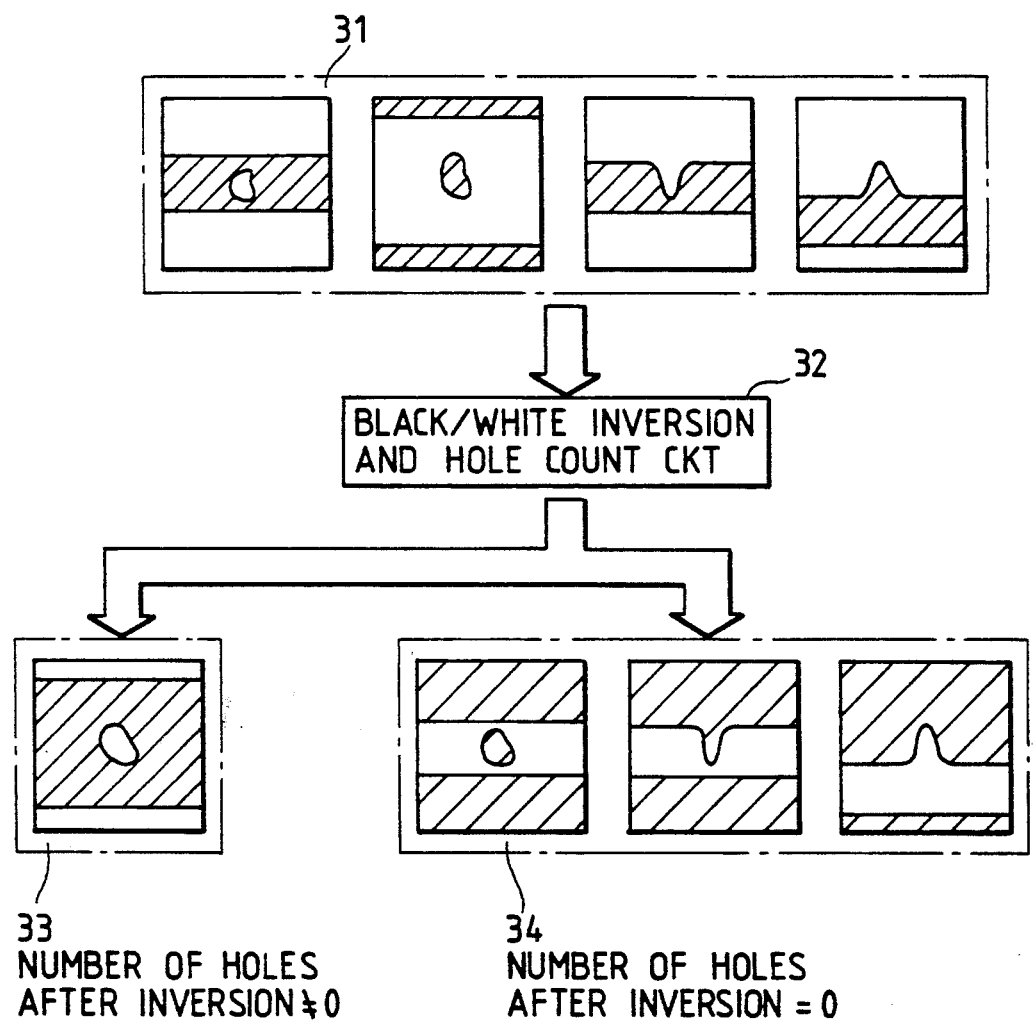

FIG. 15 gives still another case showing how to determine the candidate defect concerned is a copper splash, wherein using a black-and-white inversion and hole number count circuit 32, the black and white colors of the respective pixels in respective window interior images 31 which are the same as those 28 presented in FIG. 14 are inverted, and subsequently, the number of holes existing within the inverted images are counted. Finding that hole number count is more than 0 ($\neq 0$) as shown by an image 33 draws a conclusion that the candidate defect involved is a category of copper splash; meanwhile, finding the hole number count as being equal to 0 as shown by images 34 entails a decision that the candidate defect is one of the categories other than copper splash.

Next, reference is made to FIG. 2 illustrating still another case showing how to examine the candidate defect concerned for fatal harmfulness to electrical conductivity from the local image signals Ip", Rp", and Dp" shown in FIG. 7. First, the candidate defect is checked as to whether or not, it lies at the periphery of a line circuit pattern, if it is therein, whether or not the candidate defect is existing at the periphery of a large areal circuit pattern, or if it is located therein. Thereafter, to lessen the time of examining each candidate defect for fatal harmfulness to electrical conductivity, the local image signals Ip", Rp", and Dp" (or the local image signals Ip" and Rp") have their respective windows set up so that a part of each local image signal referred to above will go through image processing. As already remarked, the defects harmful to electrical conductivity come in such categories as mouse bit, (i.e. indent or intrusion) pinhole, spur or extrusion and copper splash (i.e. isolation defect). Noting this, the candidate defect involved is confirmed as to whether or not it is a pinhole or if it is a copper splash. Thereafter, such candidate defects as given in FIGS. 8 and 9 are examined for fatal harmfulness to electrical conductivity.

Figure 16:
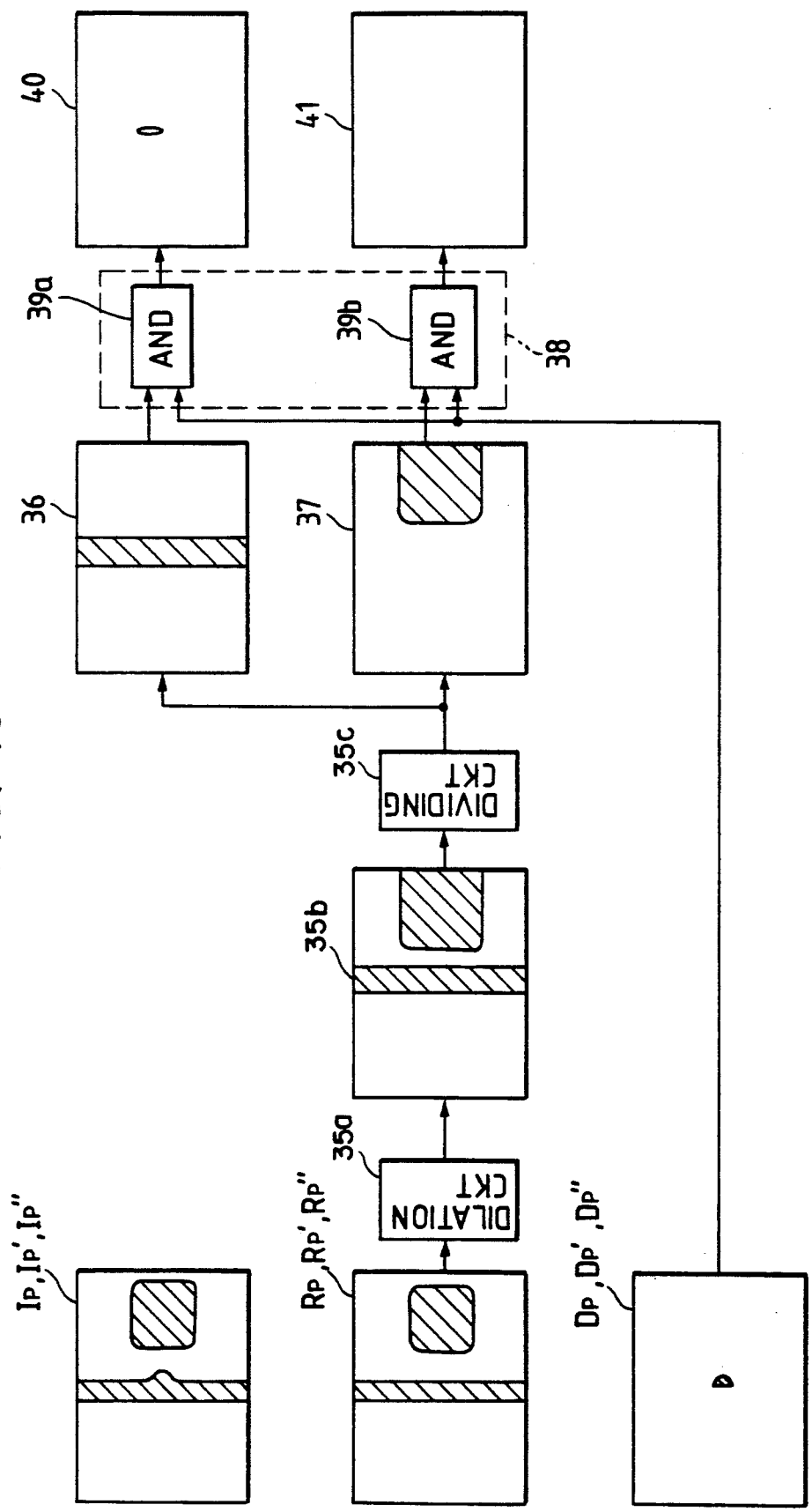

Illustrated in FIG. 16 is still another case showing how to make sure whether or not the candidate defect concerned lies at the periphery of a line circuit pattern, if it is existing therein, whether or not the suspect defect is located at the periphery of a large areal circuit pattern or it is existing therein. The local image signal Rp, Rp' or Rp" are enlarged through a dilation circuit 35a, whereby an enlarged image signal 35b is obtained; subsequently, using a dividing circuit 35c, the enlarged image signal is divided into an image signal 36 of the line circuit pattern and another image signal 37 of the large areal circuit pattern. Thereafter, the image signal 36 of the line circuit pattern, the image signal 37 of the large areal circuit pattern, and the local image signal Dp, Dp' or Dp" undergo image processing by the digital image processor 38 which includes AND circuits 39a and 39b, whereby a defect image signal 40 and a defect-free image signal 41 are obtained.

Figure 17A:
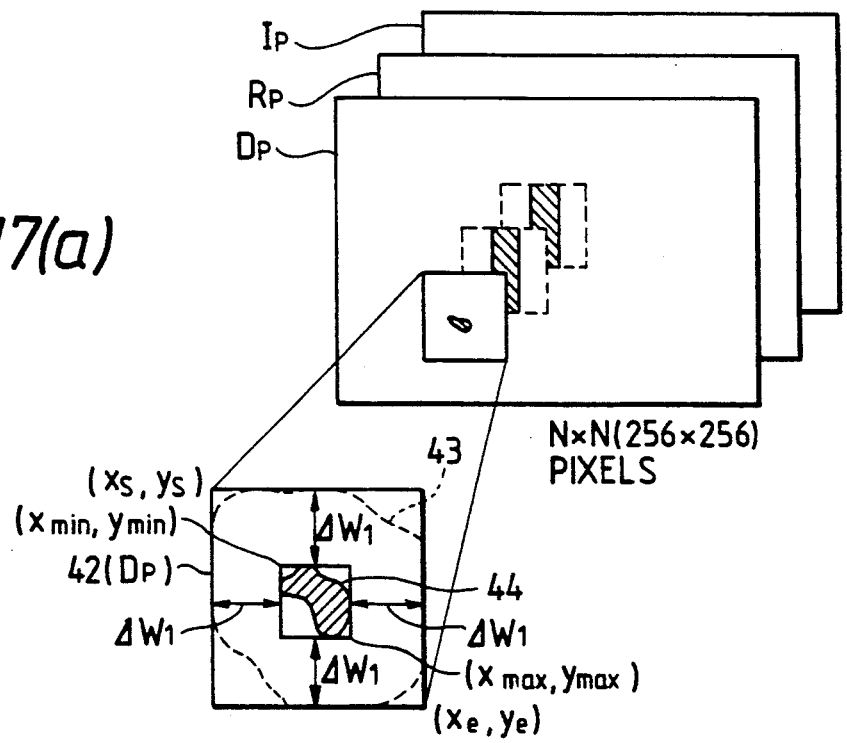
Figure 17B:
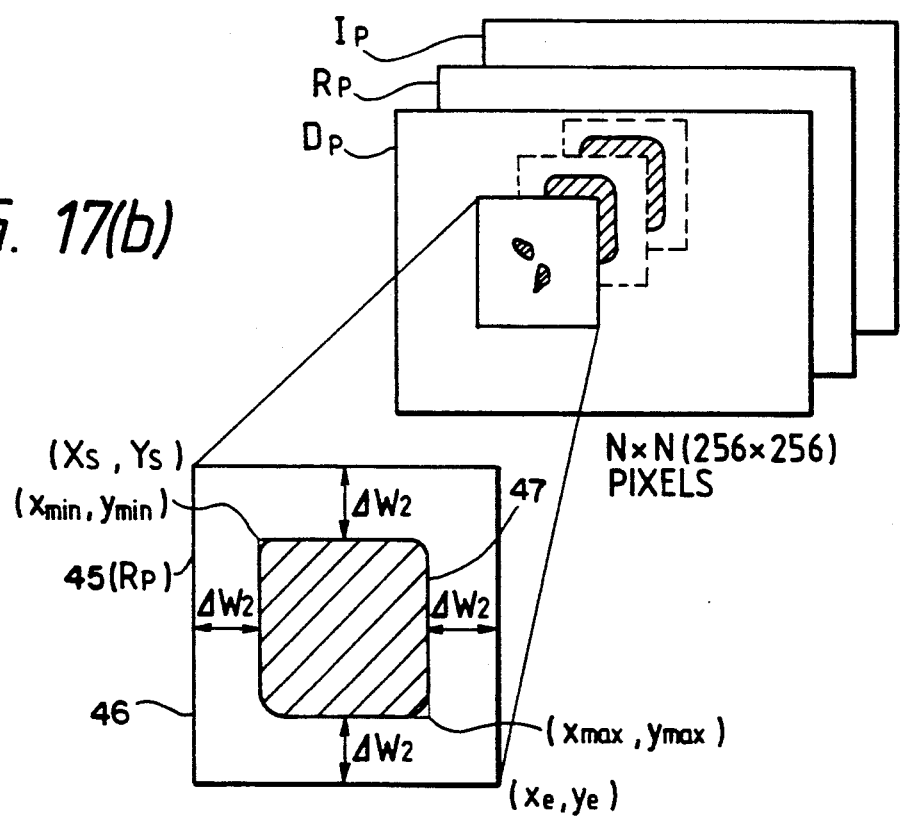

FIG. 17 (a) gives still another case showing how to set a window at the region with a candidate defect 44 which lies at the periphery of a line circuit pattern or within said line circuit pattern. Precisely with this case, respective windows 42 of identical sizes are set up at the same locations of the local image signals Ip, Rp, and Dp so that each window will cover a region 43. How to calculate an optimal window size and how to select a proper window location are the same as exemplified in FIG. 13 (a).

FIG. 17 (b) indicates still another case showing how to set a window 45 at the region with a candidate defect which is existing at the periphery of a large areal circuit pattern or within the large areal circuit pattern. Particularly with this case, respective windows 45 of identical sizes are set up at the same locations of the local image signals Ip, Rp and Dp. Each window 45 has its optimal size and location selected to cover a region 46 within a certain distance (the minimum inter-circuit pattern gap complying with the reference value of the inspection standard) in the neighborhood of the large areal circuit pattern. In other words, excepting the step through which the coordinate values (x-min, y-min) and (x-max, y-max) of respective points which the candidate defect has on the diagonals of a rectangle including the large areal circuit pattern 47 are obtained from the local image signal Rp, the window setting procedure is the same as that illustrated in FIG. 13 (b). The process of ascertaining whether or not the candidate defect involved is a pinhole in the case of FIGS. 17 (a) and 17 (b) is identical with the process illustrated in FIG. 14. Meanwhile, the procedure of checking if the candidate defect is a copper splash is the same as presented in FIG. 15.

Illustrated in FIG. 18 an exemplified algorithm to determine whether or not the candidate defect concerned which is a mouse bit existing at the periphery of a line circuit pattern illustrated in FIG. 8 (i), is fatally harmful with regard to electrical conductivity. Shown within a window 48 for the local image signal Ip is an image from the local image signal Ip of a circuit pattern with a candidate defect, a mouse bit. A window 49 for the local image signal Rp presents an image of the local image signal Rp of a reference circuit pattern.

First, using a border coordinate measurement circuit 50, a border coordinate point (xi, yi), i.e. the coordinate values of a pattern's edge, of an image 52 in the window 48 is measured. The algorithm to obtain each border coordinate point applied, is well known. One example of this well known technique can be found in, J. R. Ullmann, Chapter 2.4.2, Edge Detection, Pattern Recognition Techniques, pages 43–43.

Next, from the window 49 for the local image signal Rp, an angle of 0 perpendicular to a border line at each border coordinate point of an image 53 is obtained, using an angle-$\theta$ measurement circuit 51. The angle $\theta$ can be obtained from the 3×3 mask pattern 54. The direction obtainable in this case is a 16th direction (one of 16 different directions into which 360° is equally divided by 22.5°) as shown by a reference numeral 55. The background of having applied the window 49 for the local image signal Rp to obtain the angle $\theta$ perpendicular to a border line lies in the fact a local image within the window 48 for the local image signal Ip carries some defects as well as concavities and convexities.

Then, the coordinate values (xj, yj) are obtained. These values represent the point, which maybe off as much as the minimum width $t_1$ of the circuit pattern from the reference value of the inspection standard. This reference value point being given by the coordinate values (xi, yi) in the direction along the angle $\theta$ shown in a window 56 are obtained. The pixels between these two coordinate points are then checked for their colors. The existence of a single white pixel thus confirmed gives forth the information that the circuit pattern involved carries a defect fatally harmful to electrical conductivity. On the other hand, where all the pixels between these two points turn out black, it signifies that the circuit pattern includes no defect which is fatally harmful in respect of electrical conductivity.

Similarly to the above, the coordinate values (xk, yk) of the point apart as much as the minimum pattern width Cw from the point given by the border coordinate values (xi, yi) in the direction along the angle $\theta$ shown in a window 57 is obtained.

Next, the length $v_1$ of the dotted line which crosses a mouse bit, running longitudinally of the circuit pattern via the point given by the coordinate values (xk, yk), is obtained. The entity of the length $v_1$ made up of some white pixels serially arranged greater than the reference value of the inspection standard gives forth a fact that the circuit pattern has a defect fatally harmful. Meanwhile, in the event the length $v_1$ is less than the reference value of the inspection standard, it means that the circuit pattern has no defect which is fatally harmful with regard to electrical conductivity.

Quoted in FIG. 19 is another algorithm applied to determine if the candidate defect of the pinhole existing within a line circuit pattern presented in FIG. 8 (ii) is fatally harmful or not. A window 101 for the local image signal Ip presents therein an image of the local image signal Ip of a line circuit pattern including a pinhole candidate defect. With reference to the window 101 for the local image signal Ip, the line circuit pattern is aslant. In view of this, the inclination angle of the line circuit pattern is measured, followed by turning the line circuit pattern, using an angle-$\theta$ measurement and rotation circuit 102 until it is positioned for ease of measurement as shown by a pattern 103. How much is the angle of turning the line circuit pattern is clarified through measurement of the angle $\theta$ of an inertia principal axis, using the angle-$\theta$ measurement and rotation circuit 102. Turning the line circuit pattern may be effected by making use of the affine transformation, whereby a turned line circuit pattern 103 is made available. Through black and white color inversion of the pixels by use of a black-and-white color inversion (NOT) circuit 104, an image signal 105 for the line circuit pattern 103 is obtained; successively, pinhole image extraction processing is implemented, using a pinhole image extracting circuit 108, with a measurement-use line circuit pattern 109 which had a pinhole image extracted, provided. Now with reference to this measurement-use line circuit pattern, $x_1$ (minimum value of the x-axis coordinate where the measurement-use line circuit pattern exists), $y_1$ (minimum value of the y-axis coordinate where the above circuit pattern lies), $x_2$ (maximum value of the x-axis coordinate where the same circuit pattern is located), and $y_2$ (maximum value of the y-axis coordinate where the same circuit pattern exists) are obtained. The length in the longitudinal direction of the circuit pattern with the pinhole image extracted is equal to $x_2-x_1$ designated as $v_2$. The entity of $v_2$ found greater than the inspection standard conveys a fact that the pinhole candidate defect is fatally harmful to electrical conductivity while if $v_2$ is smaller the reference value of than the inspection standard, it signifies that the candidate defect is not fatally harmful with regard to electrical conductivity.

Next, assuming that the circuit pattern width is l, the sum $t_2$ of the minimum distances from the pinhole to the line circuit's respective borders is given by $l-(y_2-y_1)$; therefore, using a hole filling circuit 106, the pinhole of the turned circuit pattern 103 is filled up, whereby a measurement-use circuit pattern 107 is obtained. The pattern width l of this measurement-use circuit pattern 107 is measured. Pinhole filling may be implemented by performing OR operation between the turned circuit pattern 103 and the measurement-use circuit pattern 109, with the measurement-use circuit pattern 107 subsequently provided. Then, with reference to the measurement-use circuit pattern 67, it suffices to measure the circuit pattern width l, in the direction vertical to the line circuit pattern's longitudinal direction, on a segment which run between $(x_1, y_1)$ and $(x_2, y_2)$. Where $t_2$ is found smaller than the reference value of the inspection standard, it means that there exists a fatally harmful defect; on the other hand, finding that $t_2$ is greater than the reference value of the inspection standard coincides with a decision that there is no fatally harmful defect.

Exemplified in FIG. 20 is another algorithm to examine whether or not the candidate defect of a spur or extrusion lying at the periphery of the circuit pattern in FIG. 8 (iii) is fatally harmful to electrical conductivity. With regard to FIG. 20, a window 70 for the local image signal Ip presents an image of the local image signal Ip of the region which carries a spur or extrusion candidate defect. Further, a window 71 for the local image signal Rp gives an image of the local image signal Rp representing a reference circuit pattern. According to this algorithm, using a neighborhood pattern extraction circuit 72, a neighborhood circuit pattern 74 is extracted first from the image within the window 70 for the local image signal Ip. Subsequently, a border coordinate point (xi, yi), i.e. coordinate values of the pattern's edge, on the border line of the neighborhood circuit pattern 74 is extracted, using a border coordinate measurement circuit 76. The algorithm to obtain border coordinates is identical with the algorithm applicable to the case where a mouse bit candidate defect is examined whether or not it is fatally harmful to electrical conductivity. Meanwhile, using a neighborhood circuit pattern extraction circuit 73, a neighborhood circuit pattern 75 is taken out from the image within the window 71 for the local image signal Rp. Subsequently, an angle of $\theta$ defining verticality to the border line at each border coordinate point on the image in a window 79 is determined from the neighborhood circuit pattern, using an angle-$\theta$ measurement circuit 77. The algorithm to measure the angle $\theta$ is the same as that applicable to the case where a mouse bit candidate defect is examined whether or not it is fatally harmful to electrical conductivity. A 3×3 mask pattern is designated herein by a reference numeral 80. In an image within a window 81, the coordinate values (xj, yj) of a point off as much as the minimum value, $n_1$ of the inter-circuit pattern gap, which is the reference value of the inspection standard, in the direction defined by the angle $\theta$, from the border coordinate point (xi, yi), and are obtained, as illustrated in the window 81. Successively, the pixels between these two coordinate points are examined for their colors. The existence of a single black pixel thus confirmed through the examination signifies that there is a fatally harmful defect with respect to electrical conductivity. On the other hand, finding that all the pixels are white agrees with a conclusion that there exists no fatally harmful defect with regard to electrical conductivity.

Similarly to the above, the coordinate values (xk, yk) of a point away as much as the minimum inter-circuit pattern gap Ci in the direction defined by the angle $\theta$, as shown in an image within a window 82, are obtained by reference to the coordinates of one border coordinate point (xi, yi). Next, the length $m_1$ which the dotted line extending longitudinally of a line circuit pattern via the point given by the coordinates (xk, yk) exhibits in its crossing the spur or extrusion candidate defect, is determined. Finding that the length $m_1$ made up of serially arranged black pixels is longer than the inspection standard reference value may draw a conclusion that the candidate defect concerned is fatally harmful to electrical conductivity. Meanwhile, if the length $m_1$ is confirmed to be less than the inspection standard reference value, it signifies that the candidate defect involved is not fatally harmful concerning electrical conductivity.

Figure 21:
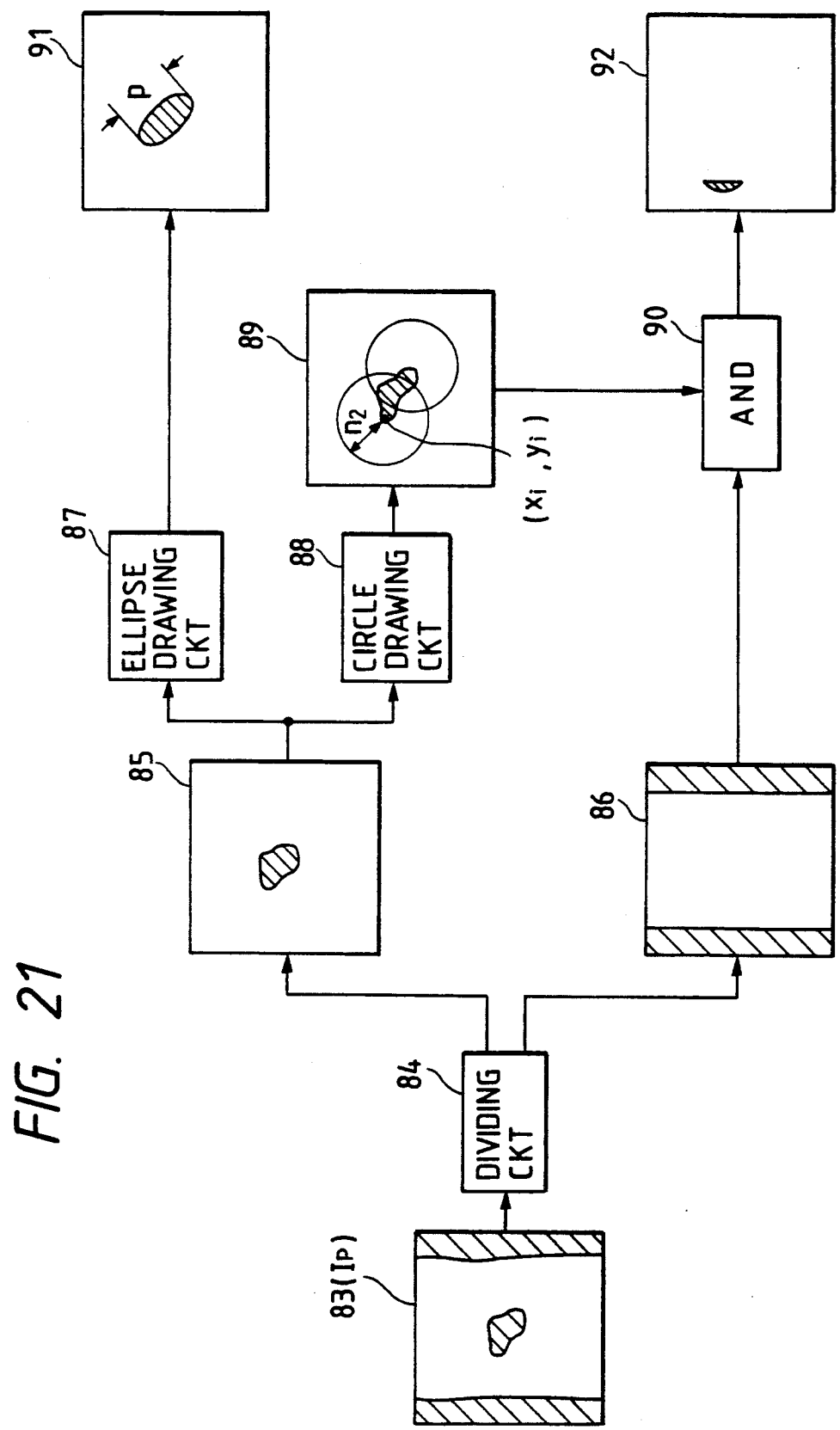

Presented in FIG. 21 is still another algorithm to examine whether or not a copper splash candidate defect specified in FIG. 8 (iv) is fatally harmful regarding electrical conductivity. A window 83 for the local image signal Ip presents an image of the local image signal Ip representing a copper splash and its adjacent normal circuit pattern. The image within the window 83 is first divided into a copper splash image within a window 85 and a neighborhood circuit pattern image within a window 86, using a dividing circuit 84. The method called "labeling" applied for this division is generally known. To determine how much is the maximum diameter p of the copper splash, an ellipse featuring a uniform secondary moment is provided, using an ellipse drawing circuit 87. Through this step, a measurement-use circuit pattern 91 is obtained, followed by measuring the length p of a major axis of the ellipse to decide the maximum diameter of the copper splash. Where p is greater than the inspection standard reference value, it signifies that the copper splash is a defect fatally harmful concerning electrical conductivity. Meanwhile, p less than the inspection standard reference value conveys the information that the copper splash is not a defect fatally harmful to electrical conductivity.

Next, to measure the gap $n_2$ between the copper splash and the neighborhood normal circuit pattern, a circle with a radius of the inspection standard equal to the gap $n_2$ is drawn, using a circle drawing circuit 88, with the border coordinate point (xi, yi) of the copper splash on the image within the window 89 made center. Thus, a circle-drawn, copper splash-contained pattern image within a window 89 is prepared. Successively, using an AND circuit 90, the circuit-drawn, copper splash-contained circuit pattern image within the window 89 and the neighborhood normal circuit pattern image are subjected to AND operation, whereby a measurement-use circuit pattern 92 is provided. Now with reference to the measurement-use circuit pattern 92, where the number of circuit patterns is found unequal to 0, the gap $n_2$ is lesser than the inspection standard reference value, signifying that the copper splash is a defect fatally harmful regarding electrical conductivity. Meanwhile, in the event the number of circuit patterns therein is confirmed equal to 0, the gap $n_2$ is greater than the inspection standard reference value, whereby it is meant that the copper splash is not a defect fatally harmful to electrical conductivity.

Figure 22:
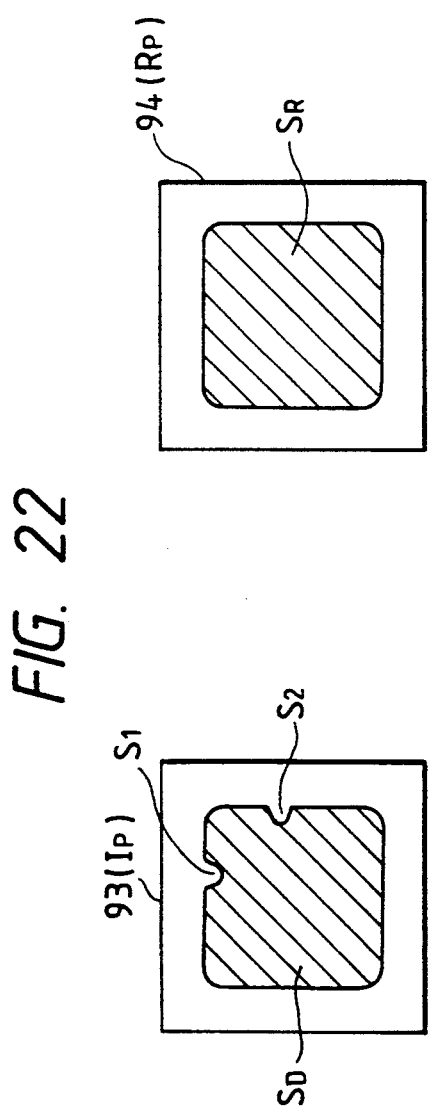

FIG. 22 presents still another algorithm to examine whether or not a mouse bit candidate defect existing at the periphery of a large areal circuit pattern shown in FIG. 9 (v) is fatally harmful in respect of electrical conductivity. A window 93 for the local image signal Ip gives an image of the local image signal Ip of a large areal circuit pattern carrying mouse bits. In addition, a window 94 for the local image signal Rp likewise presents an image of the local image signal representing a reference circuit pattern. First with reference to the window 93 for the local image signal Ip, the area $S_D$ of the defect-contained large areal circuit regional pattern is measured. Subsequently with reference to the window 94 for the local image signal Rp, the area $S_R$ of the reference circuit pattern is also measured thereby to figure out $\Sigma Si = S_R - S_D$. Where the area, $\Sigma Si$ is greater than the inspection standard reference value, there comes a conclusion that there exists a defect fatally harmful to electrical conductivity. In the meanwhile, if the area, $\Sigma Si$ is lesser than the inspection standard reference value, it signifies that there lies no defect fatally harmful concerning electrical conductivity.

Figure 23:
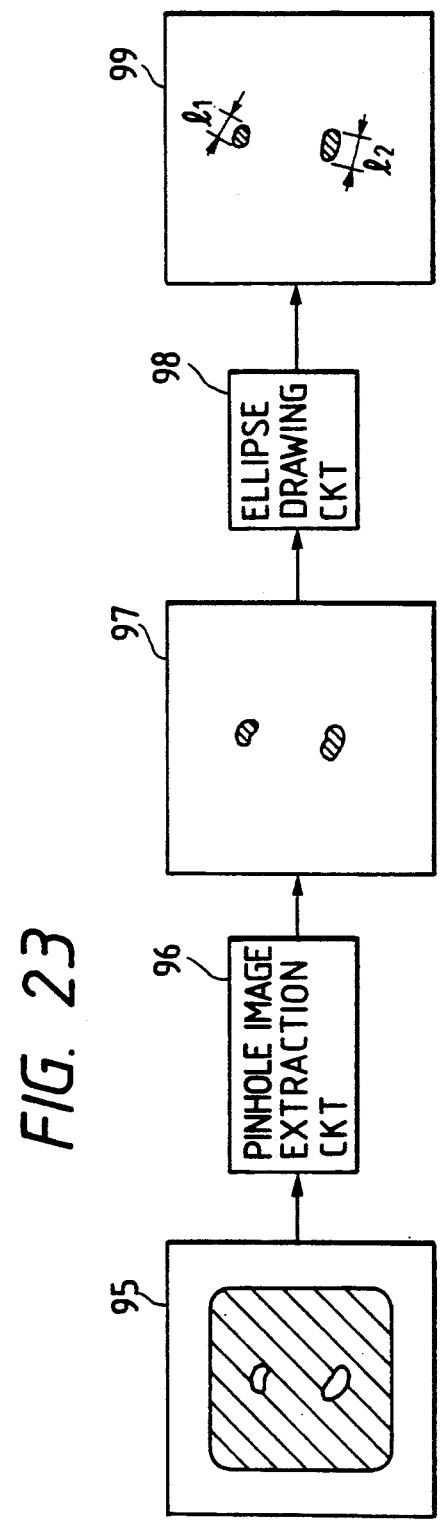

FIG. 23 shows still another algorithm to examine whether or not a pinhole candidate defect laying within a large areal circuit pattern illustrated in FIG. 9 (vi) is fatally harmful to electrical conductivity of this circuit pattern. A window 95 gives an image of the local image signal Ip of a pinhole-contained large areal circuit pattern. With reference to the window 95 for the local image signal Ip, pinhole image extraction processing is implemented, using a pinhole image extracting circuit 96, whereby a pinhole image signal 97 is provided. Now for each pinhole, an ellipse (measurement-use pinhole image 99) featuring a uniform secondary moment is prepared, followed by measuring the length ii of a major axis of the ellipse thereby to figure out the sum of the lengths $\Sigma li$. In case $\Sigma li$ is larger than the inspection standard reference value, there follows a conclusion that there exists a defect fatally harmful with regard to electrical conductivity. Where $\Sigma li$ is lesser than the inspection standard reference value, it means that there lies no defect fatally harmful to electrical conductivity.

The algorithm quoted in FIG. 9 (vii) and which is applied to examine if a spur or extension candidate defect lying in a large areal circuit pattern is fatally harmful to electrical conductivity or not, is identical with the algorithm to check whether or not a spur or extrusion candidate defect existing in a line circuit pattern shown in FIG. 20 is fatally harmful concerning electrical conductivity.

As illustrated above, the present invention allows high-speed discriminative inspection to discern each defect fatally harmful to electrical conductivity from another not fatally harmful in that regard which are lying in respective circuit patterns, through optical check of individual circuit patterns of printed circuit boards in reference to a complex inspection standard, whereby the manual process used to be required for visually examining whether or not each candidate defect is a true defect fatally harmful to electrical conductivity may be eliminated, with automatizing the process of checking individual circuit patterns of respective printed circuit boards for defects, each fatally harmful to electrical conductivity, and improving reliability of examining circuit patterns for such defects as referred to above thereby rendered practicable.

We claim:

1. A method of inspecting a defect in a circuit pattern comprising the steps of:

imaging, two-dimensionally, a circuit pattern to be inspected by imaging means while the imaging means relatively scans an image of the circuit pattern so as to sequentially produce an inspection image signal representing said circuit pattern;

generating sequentially and synchronized with said scanning, a reference image signal corresponding to said inspection image signal;

detecting a candidate defect image signal and a defect designation point signal of said candidate defect obtained as by comparing said inspection image signal with said reference image signal generated sequentially;

delaying by a delay means said inspection image signal, said reference image signal and said candidate defect image signal such that said signals are transmitted at a rate asynchronous with said imaging;

storing into a local image memory,
   i) a local inspection image signal, including said candidate defect, extracted from said delayed inspection image signal,
   ii) a local reference image signal, corresponding to said local inspection image signal, extracted from said delayed reference image signal and,
   iii) a local candidate defect image signal extracted from said delayed candidate defect image signal, said storing occurring in accordance with respective writing addresses generated by said defect designation point signal;

checking whether said candidate defect exists on a line circuit pattern of said circuit pattern or an areal circuit pattern of said circuit pattern by using at least two of, i) said local inspection image signal, ii) said local reference image signal and iii) said local candidate defect image signal, said signals being selectively read out of said local image memory in accordance with respective addresses generated by said defect designation point signal;

extracting at least one of a pinhole defect, an intrusion defect and an extrusion defect for said line circuit pattern by examining whether said candidate defect exists on said line circuit pattern by processing a first partial image signal corresponding to a portion of said line circuit pattern, set within a first window including said local inspection image signal, said local candidate defect image signal or said local reference image signal;

detecting whether each of said pinhole defect, said intrusion defect and said extrusion defect detected on said line circuit pattern is a defect harmful to electrical conductivity of said line circuit pattern by comparing each of said pinhole defect, said intrusion defect and said extrusion defect with each of first standard references;

extracting at least one of said pinhole defect, said intrusion defect and said extrusion defect for said areal circuit pattern by examining whether said candidate defect exists on said areal circuit pattern, by processing a second partial image signal corresponding to a portion of said areal circuit pattern, set within a second window including said local inspection image signal, said local candidate defect image signal or said local reference image signal; and detecting whether each of said pinhole defect, intrusion defect and extrusion defect detected on said areal circuit pattern is a defect harmful to electrical conductivity of said areal circuit pattern by comparing each of said pinhole defect, said intrusion defect and said extrusion defect with each of second standard references being different from each of said first standard references.

2. A method according to claim 1 wherein in a case where said candidate defect is an intrusion defect existing at a periphery of a line circuit pattern, when a length of said intrusion defect in a longitudinal direction of said line circuit pattern is greater than a predetermined value or when a minimum width of a line circuit pattern remaining at a location where said intrusion defect lies, is less than a predetermined value, said intrusion defect is determined to be harmful to the electrical conductivity of the circuit pattern.

3. A method according to claim 1, wherein in a case where said candidate defect is a pinhole located within a line circuit pattern, when a major axial length of said pinhole is greater than a predetermined value or when a minimum width of said line circuit pattern, where said pinhole is existing, is less than a predetermined value, said pinhole defect is determined to be harmful to the electrical conductivity of the circuit pattern.

4. A method according to claim 1 wherein in a case where said candidate defect is an extrusion defect protruding from a periphery of a line circuit pattern, when a minimum gap between a normal circuit pattern adjacent to said line circuit pattern and said extrusion defect is smaller than a predetermined value or when a length of said extrusion defect in a longitudinal direction of said line circuit pattern is larger than a predetermined value, said extrusion defect is determined to be harmful to the electrical conductivity of the circuit pattern.

5. A method according to claim 1 wherein in a case where said candidate defect is a single intrusion defect existing at a periphery of said areal circuit pattern, when an area of said intrusion defect is greater than a predetermined value, said candidate defect is determined harmful to the electrical conductivity of the circuit pattern.

6. A method according to claim 1 wherein in a case where said candidate defect comprises a plurality of intrusion defects which lie at a periphery of said areal circuit pattern, when a sum of the areas of said plurality of intrusion defects is larger than a predetermined value, said intrusion defect is determined harmful to the electrical conductivity of the circuit pattern.

7. A method according to claim 1 wherein in a case where said candidate defect is a single pinhole existing within said areal circuit pattern, when a maximum diameter of said pinhole is larger than a predetermined value, said pinhole defect is determined harmful to the electrical conductivity of the circuit pattern.

8. A method according to claim 1 wherein in a case where said candidate defect comprises a plurality of pinholes existing within said areal circuit pattern, when a sum of the maximum diameters of said plurality of pinholes is greater than a predetermined value, said pinhole defects is determined harmful to the electrical conductivity of the circuit pattern.

9. A method according to claim 1 wherein in a case where said candidate defect is an extrusion defect protruding from a periphery of said areal circuit pattern, when a minimum gap between a normal circuit pattern adjacent to said areal circuit pattern and said extrusion defect is less than a predetermined value or when a length of said extrusion defect in the direction along the periphery of said areal circuit pattern is greater than a predetermined value, said extrusion defect is determined harmful to the electrical conductivity of the circuit pattern.

10. A method according to claim 1 wherein each candidate defect is identified as an intrusion defect, a pinhole defect, an extrusion defect or an isolation defect.

11. A method according to claim 1 further including:
checking a spacing between said candidate defect and at least one of said line circuit pattern and said areal circuit pattern, by using at least two local image signals selectively read out in accordance with said address of said local inspection image signal ii) said local reference image signal and iii) said local candidate defect image signal stored in said local image memory;

extracting an isolation defect by examining said candidate defect by processing a third partial image signal including said line circuit pattern or said areal circuit pattern, which are set within a third window including said local inspection image signal, said local candidate defect image signal or said local reference image signal; and detecting whether said isolation defect is harmful to electrical conductivity of said line circuit pattern or said areal circuit pattern by comparing said isolation defect with third standard references.

12. A method according to claim 1 wherein, in a case where said candidate defect is on an inclined line circuit pattern or areal circuit pattern further including, rotating an image of said line circuit pattern or areal circuit pattern by a desired angle to improve detection of said pinhole defect, said intrusion defect and said extrusion defect.

13. A method according to claim 11 wherein in a case where said candidate defect is said isolation defect, when the maximum diameter of said isolation defect is greater than a predetermined value or when a gap between the isolation defect and a normal circuit pattern in a neighborhood of said isolation defect and said isolation defect is less than a predetermined value, said isolation defect is determined to be harmful to the electrical conductivity of the circuit pattern.

14. A method of inspecting a defect in a circuit pattern comprising the steps of:
imaging a circuit pattern to be inspected to produce an image signal representing said circuit pattern to be inspected;

comparing said image signal with a reference image signal at a rate synchronized with a rate at which said imaging occurs, and detecting candidate defects which exist in said circuit pattern to be inspected on the basis of said comparison in order to generate a candidate defect signal;

extracting from said image signal, said reference signal, and said candidate defect signal an extracted local image signal including,
i) a first local image signal which includes, a local image signal representing a local image covering a region including each of the detected candidate defects existing in an image of said circuit pattern to be inspected, and a local reference image signal corresponding to said local image, and ii) a second local image signal representing an image of said each of the detected candidate defects;

storing the extracted local image signal into a memory means;

reading out said extracted local image signal stored in the memory means;

dividing the first local image signal from said read out extracted local image signal into a first image signal representing a line circuit pattern and a second image signal representing an areal circuit pattern, and providing an enlarged local image signal representing an image enlarged from that given by the second local image signal from said read out extracted local image signal;

examining whether at least one of the detected candidate defects exists on said line circuit pattern or exists on said areal circuit pattern, on the basis of said first image signal, said second image signal and said enlarged local image signal; and detecting whether a first candidate defect of said candidate defects in a defect harmful to electrical conductivity of said line circuit pattern by comparing said first candidate defect with first standard references and detecting whether a second candidate defect of said candidate defects is harmful to electrical conductivity of said areal circuit pattern by comparing said second candidate defect said second standard references, being different from said first standard references, and, wherein said first and said second candidate defects are at least one of a pinhole defect, an intrusion defect or an extrusion defect.

15. A method of inspecting a defect in a circuit pattern comprising the steps of:

imaging a circuit pattern to be inspected to produce an image signal representing said circuit pattern to be inspected;

comparing said image signal with a reference image signal at a rate synchronized with a rate at which said imaging occurs, and detecting candidate defects which exist in said circuit pattern to be inspected on the basis of said comparison in order to generate a candidate defect signal;

extracting from said image signal, said reference signal and said candidate defect signal from an extracted local image signal including, i) a first local image signal which includes a local image signal representing a local image covering a region including each of the detected candidate defects existing in an image of said circuit pattern to be inspected, and a local reference image signal corresponding to said local image, and ii) a second local image signal representing an image of said each of the detected candidate defects;

storing the extracted local image signal into a memory means;

reading out said extracted local image signal stored in the memory means;

dividing the first local image signal from said read out extracted local image signal into a first image signal representing a line circuit pattern and a second image signal representing an areal circuit pattern, and providing an enlarged local image signal representing an image enlarged from that given by the second local image signal from said read out extracted local image signal;

examining whether at least one of the detected candidate defects exists on said line circuit pattern or on said areal circuit pattern, on the basis of said first image signal, said second image signal and said enlarged local image signal;

picking up (i) a first partial image signal from said local image signal by setting a first window which encloses a first candidate defect determined to exist on said line circuit pattern with a predetermined first distance from an outline of the first candidate defect, when the first candidate defect has been examined and is determined to exist on said line circuit pattern, and (ii) a second partial image signal from said local image signal by setting a second window which encloses said areal circuit pattern including a second candidate defect determined to exist on said areal circuit pattern with a predetermined distance from an outline of said areal circuit pattern including the second candidate defect, when the second candidate defect has been examined and it is determined to exist on said areal circuit pattern; and detecting whether said first candidate defect of said candidate defects is harmful to electrical conductivity of said line circuit pattern by comparing said first candidate defect with a first standard reference, and detecting whether said second candidate defect is harmful to electrical conductivity of said areal circuit pattern by comparing said second candidate defect with a second standard reference being different from said first standard reference, and wherein said first and second candidate defects are at least one of a pinhole defect, an intrusion defect or an extrusion defect.

16. A method according to claim 15 wherein said first candidate defect is determined to be a pinhole defect located within said line circuit pattern by counting a number of holes contained in said first partial image signal picked up by said first window.

17. A method according to claim 15 wherein said first candidate defect is determined to be an isolation defect located at the periphery of said line circuit pattern by counting a number of holes contained in the inverted first partial image signal which is obtained through inverting said first partial image signal picked up by said first window.

18. A system for inspecting a defect in a circuit pattern comprising:

imaging means for imaging, two-dimensionally, a circuit pattern to be inspected by the imaging means while the imaging means relatively scans an image of the circuit so as to sequentially produce an inspection image signal representing said circuit pattern;

reference generating means for sequentially generating, in synchronization with said scanning, a reference image signal corresponding to said inspection image signal;

candidate defect detecting means for generating a candidate defect image signal and a defect designation point signal of candidate defects detected by comparing said inspection image signal with said sequentially generated reference image signal;

delay means for delaying each of said inspection image signal, said reference image signal and said candidate defect image signal such that said signals are transmitted at a rate asynchronous with said scanning;

local image memory means for storing,
  i) a local inspection image signal including at least one of said detected candidate defects extracted from said delayed inspection image signal,
  ii) a local reference image signal corresponding to said local inspection image signal, said local reference image signal being extracted from said delayed reference image signal, and
  iii) a local candidate defect image signal extracted from said delayed candidate defect image signal, said signals stored in accordance with an address generated by said defect designation point signal;

checking means for checking whether said candidate defects exist on a line circuit pattern of said circuit pattern or an areal circuit pattern of said circuit pattern by using at least two of, i) said local inspection image signal, ii) said local reference image signal and iii) said local candidate defect image signal, said signals being selectively read out of said local image memory in accordance with said address generated by said defect designation point signal;

extracting means for extracting at least one of a pinhole defect, an intrusion defect and an extrusion defect for said line circuit pattern by examining whether said candidate defect exists on said line circuit pattern by processing a first partial image signal corresponding to a portion of said line circuit pattern set within a first window, including said local inspection image signal, said local candidate defect image signal or said local reference image signal;

detecting means for detecting whether each of said pinhole defect, said intrusion defect and said extrusion defect found on said line circuit pattern is a defect harmful to electrical conductivity of said line circuit pattern, by comparing each of said pinhole defect, said intrusion defect and said extrusion defect with each of first standard references;

extracting means for extracting at least one of said pinhole defect, said intrusion defect and said extrusion defect for said areal circuit pattern by examining whether said candidate defect exists on said areal circuit pattern, by processing a second partial image signal corresponding to a portion of said areal circuit pattern set within a second window, including said local inspection image signal, said local candidate defect image signal or said local reference image signal; and detecting means for detecting whether each of said pinhole defect, said intrusion defect and said extrusion defect detected on said areal circuit pattern is a defect harmful to electrical conductivity of said areal circuit pattern, by comparing each of said pinhole defect said intrusion defect and said extrusion defect with each of second standard references, being different with said each of first standard references.

19. A system according to claim 18 wherein said candidate defect detecting means processes each image signal in a mode of a pipeline image processing.

20. A method of inspecting a defect in a circuit pattern comprising the steps of:

imaging a circuit pattern to be inspected so as to produce an image signal representing said circuit pattern;

comparing said image signal with a reference image signal at a rate synchronized with a rate of said imaging, and detecting candidate defects which exist in said circuit pattern on the basis of the result of said comparison;

extracting local image signals including,
  i) a first local image signal which includes a local image signal representing a local image covering a region including each of the detected candidate defects existing in said image of said circuit pattern to be inspected and a local reference image signal corresponding to said local image, and
  ii) a second image signal representing an image of each of the detected candidate defects;

storing the extracted local image signals into a memory means;

reading out said extracted local image signals stored in the memory means;

checking whether said candidate defects including at least one of a pinhole defect, an intrusion defect and an extrusion defect exist on a line circuit pattern of said circuit pattern or an areal circuit pattern of said circuit pattern by using at least two of said extracted local image signals which are selectively read out from said memory means in accordance with writing addresses generated by a defect designation point signal which corresponds to said local inspection image signal, said local reference image signal and said local candidate defect image signal stored in said memory means; and determining whether first candidate defects of said candidate defects located on said line circuit pattern are harmful, to electrical conductivity of said line circuit pattern, by comparing said first candidate defects with first standard references, and whether second candidate defects of said candidate defects located on said areal circuit pattern are harmful to electrical conductivity of said area circuit pattern, by comparing said second candidate defects with second standard references being different from said first standard references and wherein said first and second candidate defects are at least one of said pinhole defect, said intrusion defect and said extrusion defect.

21. A system of inspecting a defect in a circuit pattern comprising the steps of:

imaging means for imaging a circuit pattern to be inspected so as to produce an image signal representing said circuit pattern to be inspected;

candidate defect detecting means for detecting, at a rate synchronized with a rate at which said imaging occurs candidate defects which exist in said circuit pattern to be inspected by comparing said image signal with a reference image signal;

extracting means for extracting,
  i) a first local image signal which includes a local inspection image signal representing a local image covering a region including each of the detected candidate defects existing in said image of said circuit pattern to be inspected and a local reference image signal corresponding to said local image, and
  ii) a second local image signal representing an image of each of the detected candidate defects;

memory means for storing the extracted local image signals;

checking means for checking whether said candidate defects including at least one of a pinhole defect, an intrusion defect and an extrusion defect exist on a line circuit pattern of said circuit pattern or an areal circuit pattern of said circuit pattern by using at least two of said local image signals which are selectively read out from said memory means, in accordance with writing addresses generated by a defect designation point signal which corresponds to said local inspection image signal, said local reference image signal and said local candidate defect image signal stored in said memory means; and determining means for determining whether first candidate defects of said candidate defects located on said line circuit pattern are harmful to electrical conductivity of said line circuit pattern by comparing said first candidate defects with first standard references, and whether second candidate defects of said candidate defects located on said areal circuit pattern are harmful to electrical conductivity of said areal circuit pattern by comparing said second candidate defects with second standard references being different with said first standard references and wherein said first and second candidate references and wherein said first and second candidate defects are at least one of said pinhole defect, said intrusion defect, and said extrusion defect.

* * * * *

UNITED STATES PATENT AND TRADEMARK OFFICE
CERTIFICATE OF CORRECTION

PATENT NO. : 5,146,509
DATED : September 8, 1992
INVENTOR(S) : Yasuhiko Hara, et al.

It is certified that error appears in the above-identified patent and that said Letters Patent is hereby corrected as shown below:

Claim 1, column 16, line 46, after "with" insert --said--.

Claim 11, column 18, line 21, after "address of" insert --, i)--.

Claim 14, column 19, line 25, delete "in" and replace with --is--.

Claim 14, column 19, line 31, after "defect" delete "said" and replace with --with--.

Claim 18, column 20, line 55, after "circuit" insert --pattern--.

Claim 20, column 22, line 16, after "second" insert --local--.

Claim 20, column 22, line 41, delete "area" and replace with --areal--.

Claim 21, column 24, lines 13-14, delete "references and wherein said first and second candidate".

Signed and Sealed this

Twenty-third Day of November, 1993

Attest:

BRUCE LEHMAN

*Attesting Officer*     *Commissioner of Patents and Trademarks*